United States Patent
Lee et al.

(10) Patent No.: US 7,312,117 B2
(45) Date of Patent: Dec. 25, 2007

(54) SEMICONDUCTOR DEVICE AND METHOD OF MANUFACTURING THE SAME

(75) Inventors: Doo-Young Lee, Seoul (KR); Yoo-Chul Kong, Seoul (KR); Jong-Chul Park, Gyeonggi-do (KR); Sang-Sup Jeong, Gyeonggi-do (KR)

(73) Assignee: Samsung Eletronics Co., Ltd., Suwon-si, Gyeonggi-do (KR)

( * ) Notice: Subject to any disclaimer, the term of this patent is extended or adjusted under 35 U.S.C. 154(b) by 231 days.

(21) Appl. No.: 11/193,788

(22) Filed: Jul. 28, 2005

(65) Prior Publication Data

US 2006/0022256 A1    Feb. 2, 2006

(30) Foreign Application Priority Data

Jul. 29, 2004    (KR) ..................... 10-2004-0059856

(51) Int. Cl.
*H01L 21/8242*    (2006.01)
(52) U.S. Cl. ................. 438/253; 257/E21.649
(58) Field of Classification Search ........... 438/253, 438/675; 257/E21.649
See application file for complete search history.

(56) References Cited

U.S. PATENT DOCUMENTS

| | | | |
|---|---|---|---|
| 5,858,831 A * | 1/1999 | Sung | ............... 438/241 |
| 6,479,341 B1 * | 11/2002 | Lu | ............... 438/253 |
| 6,528,368 B1 | 3/2003 | Park | |

FOREIGN PATENT DOCUMENTS

| | | |
|---|---|---|
| KR | 2001-0068379 | 7/2001 |
| KR | 2002-0045657 | 6/2002 |
| KR | 2002-0058341 | 7/2002 |

OTHER PUBLICATIONS

English language abstract of the Korean Publication No. 2002-0045657.
English language abstract of the Korean Publication No. 2002-0058341.
English language abstract for Korean Publication No. 2001-0068379.

* cited by examiner

*Primary Examiner*—Chandra Chaudhari
(74) *Attorney, Agent, or Firm*—Marger Johnson & McCollom, P.C.

(57) ABSTRACT

A semiconductor device includes a word line structure that extends in a first direction on an active region defined on a substrate. First and second contact pads are formed on the active region at both sides of the word line structure. Bit line structures are electrically connected to the first contact pad and extend in a second direction substantially perpendicular to the first direction. An insulation layer structure is formed on the substrate having the bit line structures. A storage node contact plug is electrically connected to the second contact pad through the insulation layer structure. A storage node electrode, which may be part of a capacitor, is formed on the storage node contact plug. The storage node contact plug has a lower portion and an upper portion having a width wider than that of the lower portion, with vertical sides perpendicular to the first and second directions.

24 Claims, 41 Drawing Sheets

SEMICONDUCTOR DEVICE AND METHOD OF MANUFACTURING THE SAME

CROSS REFERENCE TO RELATED APPLICATION

This application claims priority under 35 USC § 119 to Korean Patent Application No. 2004-59856, filed on Jul. 29, 2004, the contents of which are herein incorporated by reference in their entirety.

FIELD OF THE INVENTION

The present invention relates to a semiconductor device and a method of manufacturing the semiconductor device. More particularly, the present invention relates to a semiconductor device that includes a storage node contact plug and a capacitor, and a method of manufacturing the semiconductor device.

BACKGROUND OF THE INVENTION

Semiconductor manufacturing technologies continue to evolve to provide memory devices having increasingly higher storage capacity, integration density, and response speed. Dynamic random access memory (DRAM) devices are most widely used as memory for electric and electronic apparatuses because such devices can have high storage capacity and integration density. A DRAM device memory cell typically includes one access transistor and one storage capacitor.

As the integration density of a DRAM device memory cell increases, the memory cell generally occupies less area on a semiconductor substrate. With less area, capacitors in the memory cells generally need improved capacitance characteristics.

The capacitance of a capacitor is increased either by using a dielectric layer of a dielectric material that has a higher dielectric constant, or the surface area of the capacitor can be increased. Some high dielectric materials that have been considered for use include Al2O3, Ta2O5, or HfO2. However, forming a capacitor with a material of high dielectric constant is complex because of process variations that occur during manufacturing.

To increase the surface area of a capacitor, stacked, trench, and cylindrical type capacitors have been substituted for planar type capacitors.

In the DRAM device, the capacitors are electrically connected to source/drain regions of a semiconductor substrate. Consequently, the locations of the capacitors are limited by the locations of these source/drain regions. When the spacing between adjacent capacitors becomes narrow, an electrical short between capacitors may occur more frequently.

To overcome the above-mentioned problems, a conventional method that is capable of ensuring an overlap margin is used. In this conventional method, storage node electrodes have an effective area regardless of the locations of drains, and are sufficiently spaced apart from each other by expanding an upper portion of a storage node contact plug.

FIGS. 1 and 2 are cross-sectional views illustrating a conventional DRAM device that includes a storage node contact plug having an expanded upper portion. FIG. 1 is a cross-sectional view taken along a line substantially parallel to a word line structure of the DRAM device and FIG. 2 is a cross-sectional view taken along a line substantially parallel to a bit line structure of the DRAM device.

Referring to FIGS. 1 and 2, isolation layers 12 for defining an active region 14 are formed in a semiconductor substrate 10. A word line structure 16 is formed on the semiconductor substrate 10. The word line structure 16 includes a gate insulation layer pattern, a gate electrode pattern and a hard mask pattern sequentially stacked.

Source/drain regions (not shown) are formed in the active region 14 at both sides of the word line structure 16. Generally, the source region is electrically connected to a bit line structure 30 and the drain region is electrically connected to a storage node electrode 38.

A first insulating interlayer 18 covers the word line structure 16. First and second contact pads 20a and 20b electrically connected to the source/drain regions, respectively, are formed at both sides of the word line structure 16.

A second insulating interlayer 22 is formed on the first insulating interlayer 18. A bit line contact (not shown) electrically connected to the first contact pad 20a is formed through the second insulating interlayer 22.

The bit line structure 30 is formed on the second insulating interlayer 22. The bit line structure 30 includes a barrier metal layer pattern 24, a tungsten layer pattern 26 and a capping layer pattern 28, sequentially stacked. A lower face of the barrier metal layer pattern 24 partially makes contact with the bit line contact. Thus, the barrier metal layer pattern 24 is electrically connected to the source region via the bit line contact.

An insulation layer structure 36 covers the bit line structure 30. The insulation layer structure 36 includes a third insulating interlayer 32 and an etching stop layer 34. The storage node contact plug 38 is electrically connected to the first contact pad 20a through the insulation layer structure 36 and the second insulating interlayer 22. The storage node contact plug 38 has a rounded upper portion, resulting in a rounded Y-shape upper portion. A storage node electrode 40 is formed on the storage node contact plug 38.

The storage node electrode 40 may have a sufficient overlap margin with respect to the storage node contact plug 38. Also, shorts between the storage node electrodes 40 may be decreased.

However, while forming the storage node contact plug 38, which fills a storage node contact hole, the storage node contact plug 38 is excessively planarized due to its rounded upper side profile.

Also, the storage node contact plugs 38 generally have widths A different from each other due to polished amounts of the planarization process, again, because of the rounded upper side profile. In particular, when the storage node contact plug 38 has a narrow width A, the overlap margin between the storage node electrode 40 and the storage node contact plug 38 is reduced.

Further, to form the rounded upper portion of the storage node contact hole, the insulation layer structure 36 and the second insulating interlayer 22 are anisotropically etched by a dry etching process and are then isotropically etched by a wet etching process. However, it is very difficult to establish recipes of the wet etching process for preventing adjacent storage contact holes from being in communication with each other and the bit line structure 30 from being exposed.

SUMMARY OF THE INVENTION

Embodiments of the present invention provide a semiconductor device that has a sufficient overlap margin between a storage node contact plug and a storage node electrode.

Embodiments of the present invention also provide a method of manufacturing the above-mentioned semiconductor device.

A semiconductor device in accordance with one embodiment of the present invention includes a word line structure that extends in a first direction on an active region defined on a substrate. First and second contact pads are formed in the active region at both sides of the word line structure. Bit line structures are electrically connected to the first contact pad and extend in a second direction substantially perpendicular to the first direction. An insulation layer structure is formed on the substrate having the bit line structures. A storage node contact plug is electrically connected to the second contact pad through the insulation layer structure. A storage node electrode is formed on the storage node contact plug. The storage node contact plug is arranged between the bit line structures. The storage node contact plug has a lower portion and an upper portion having a width wider than that of the lower portion. The upper portion of the storage node contact plug extends in the second direction and has a vertical side face substantially perpendicular to the first direction.

According to some of the embodiments of the present invention, the upper portion of the storage node contact plug has a vertical side profile. Thus, the upper portion of the storage node contact plug has a uniform width regardless of a difference of polished amounts so that a sufficient overlap margin between the storage node electrode and the storage node contact plug may be provided. Also, the storage node contact hole having the upper portion is formed using the etching stop layer so that recipes of a wet etching process may be readily established.

BRIEF DESCRIPTION OF THE DRAWINGS

The above and other features and advantages of the invention will become readily apparent by reference to the following detailed description when considered in conjunction with the accompanying drawings wherein.

DESCRIPTION OF THE EMBODIMENTS

Figure 1:
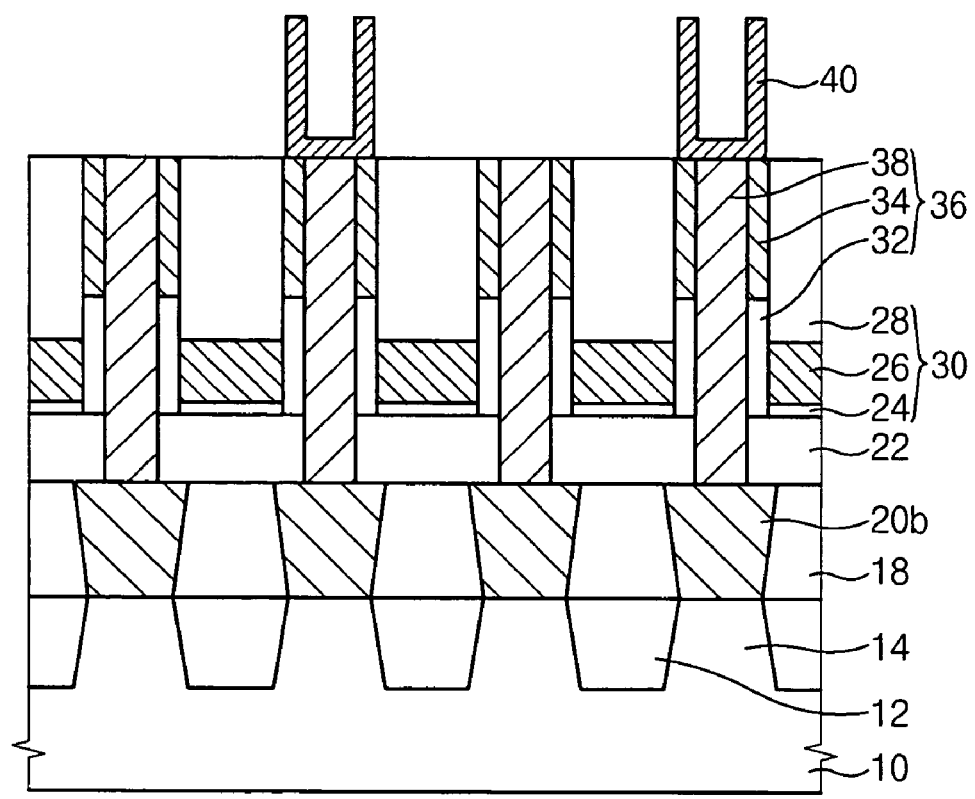
FIGS. 1 and 2 are cross-sectional views illustrating a conventional DRAM device having an expanded upper portion.
Figure 2:
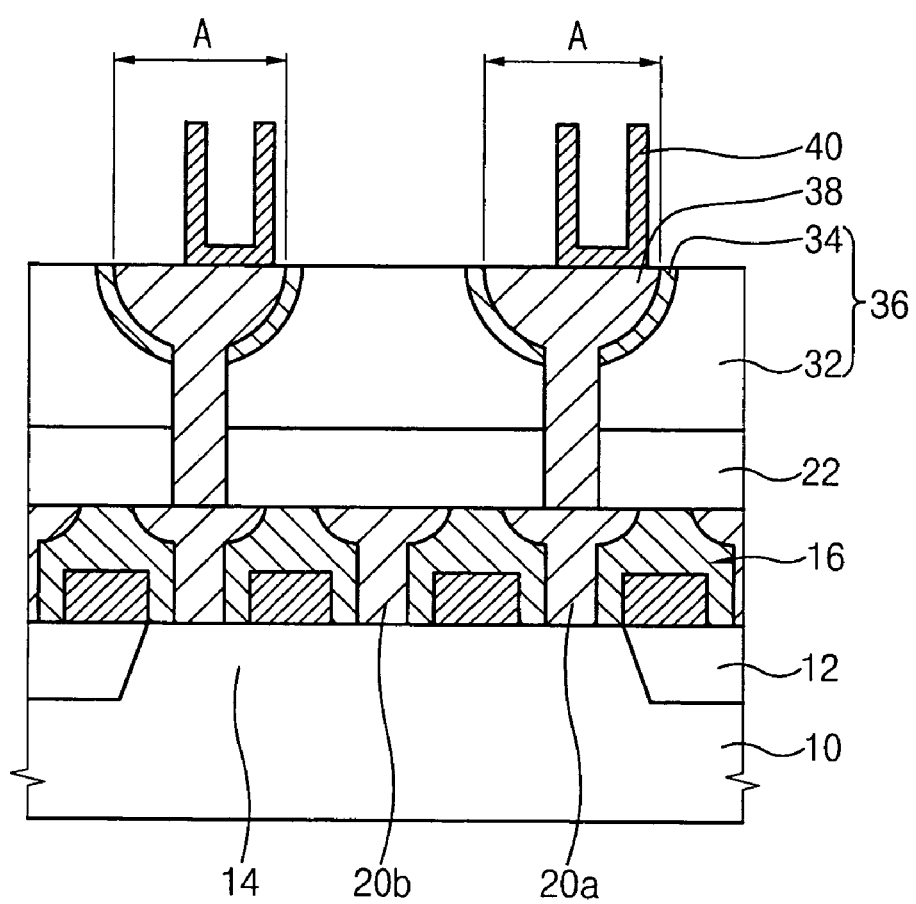

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or a layer is referred to as being "on", "connected to", or "coupled to" another element or layer, it can be directly on, connected, or coupled to the other element or layer, or intervening elements or layers may be present. In contrast, when an element is referred to as being "directly on," "directly connected to", or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer, or section discussed below could be termed a second element, component, region, layer, or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
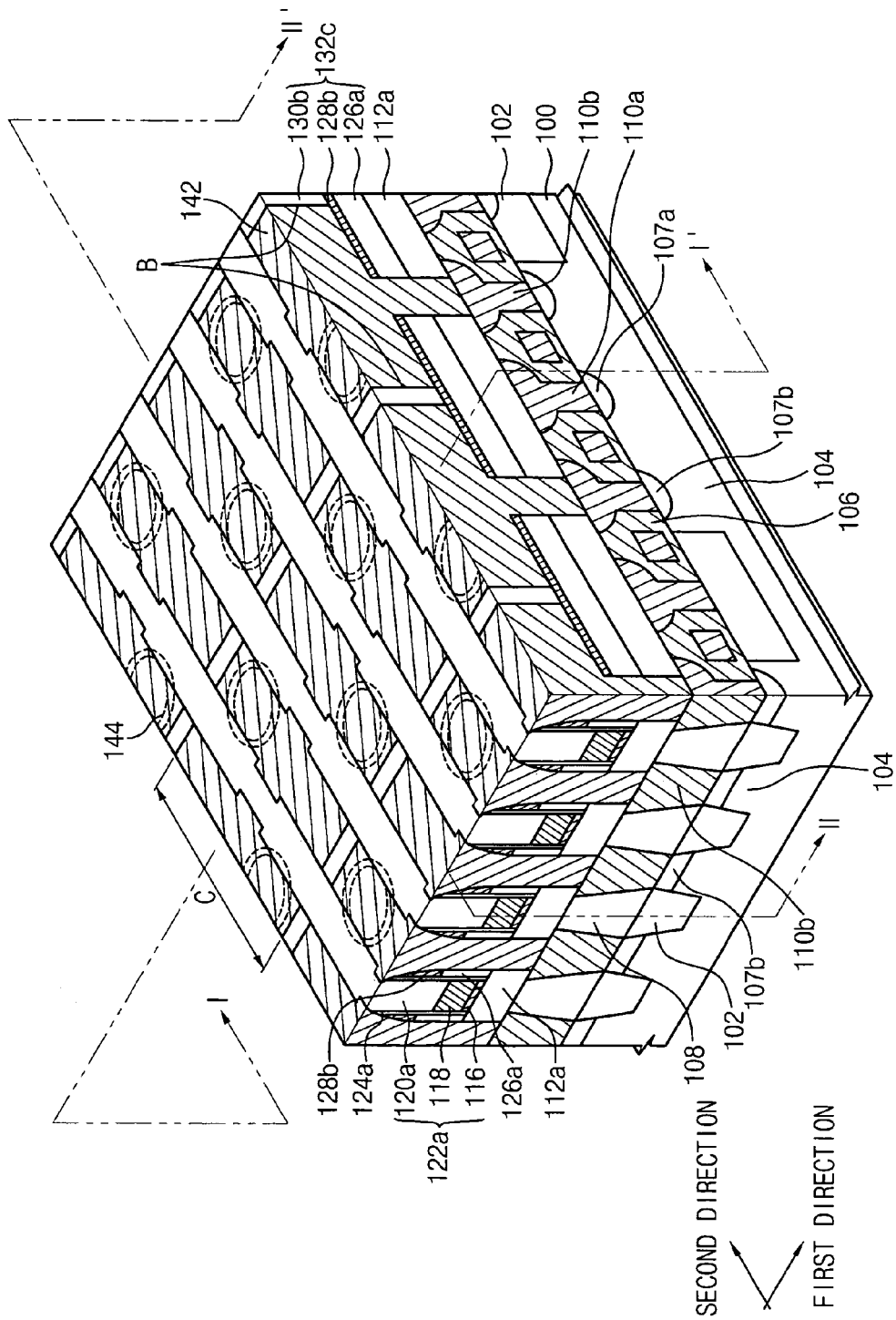
FIG. 3 is a perspective view illustrating a semiconductor device in accordance with an embodiment of the present invention.

FIG. 3 is a perspective view illustrating a semiconductor device in accordance with an embodiment of the present invention.

Referring to FIG. 3, a plurality of isolation layers 102 is formed in a semiconductor substrate 100 to define a plurality of active regions 104 on the semiconductor substrate 100. A plurality of word line structures 106 is formed on the semiconductor substrate 100. The word line structures 106 extend in a first direction traversing the active regions 104. The word line structures 106 include a gate insulating layer pattern, a gate electrode pattern and a hard mask pattern sequentially stacked.

A plurality of source regions 107a and a plurality of drain regions 107b are formed in the active regions 104 at both sides of the word line structures 106. The source regions 107a positioned in a central portion of the active regions 104 correspond to regions to which bit line structures are electrically connected. The drain regions 107b positioned at both sides of the active regions 104 correspond to regions to which a storage node electrode is electrically connected.

A first insulating interlayer 108 at least partially covers the word line structures 106. First and second contact pads 110a and 110b are electrically connected to the source region 107a and the drain region 107b, respectively.

A second insulating interlayer pattern 112a is formed on the first and second contact pads 110a and 110b and the word line structures 106. A plurality of bit line structures 122a is formed on the second insulating interlayer 112a and is electrically connected to the first contact pad 110a. The bit line structures 122a extend in a second direction substantially perpendicular to the first direction, and are electrically isolated from the word line structures 106.

The bit line structures 122a include a barrier metal layer pattern 116, a metal layer pattern 118, and a capping layer pattern 120a. A spacer 126a is formed on both sides of the barrier metal layer pattern 116, the metal layer pattern 118, and the capping layer pattern 120a. Here, the capping layer pattern 120a and the spacer 126a may include silicon nitride.

An insulation layer structure 132c is formed on the second insulating interlayer pattern 112a having the bit line structures 122a. The insulation layer pattern 132c includes a third insulating interlayer pattern 126a, an etching stop layer pattern 128b and a fourth insulating interlayer pattern 130b.

The third insulating interlayer pattern 126a is formed on the second insulating interlayer pattern 112a to partially fill a lower space between the bit line structures 122a. Also, the third insulating interlayer pattern 126a has an upper face that is positioned on a plane substantially identical to or higher than that of an upper face of the metal layer pattern 118.

The third insulating interlayer pattern 126a suppresses generation of a parasite capacitance caused by the metal layer pattern 118. Thus, the third insulating interlayer pattern 126a may include a material having a low dielectric constant, for example, silicon oxide.

The etching stop layer pattern 128b is formed on a sidewall of the bit line structures 122a exposed through the third insulating interlayer pattern 126a. The etching stop layer pattern 128b has a lower face that is positioned on a plane substantially identical to or higher than that of the upper face of the metal layer pattern 118.

The fourth insulating interlayer pattern 130b is formed on the etching stop layer pattern 128b to partially fill an upper portion of the space between the bit line structures 122a.

A plurality of storage node contact plugs 142 is formed through the insulation layer structure 132c, the second insulating interlayer pattern 112a and the bit line structures 122a, and is electrically connected to the second contact pad 110b. The storage node contact plugs 142 are positioned between the bit line structures 122a. The storage node contact plugs 142 have a lower portion and an upper portion wider than the lower portion. Also, the upper portion of the storage node contact plugs 142 extends in the second direction and has a vertical side face substantially perpendicular to the first direction.

A plurality of storage node electrodes 144 is formed on the storage node contact plugs 142. The storage node electrodes 144 may have a concave shape or a cylindrical shape. The storage node electrodes 144 correspond to the storage node contact plugs 142. Also, the storage node electrodes 144 are arranged in a zigzag pattern on the respective storage node contact plugs 142. In particular, a straight line connected between the adjacent storage node electrodes 144 is diagonal to the first and second directions.

According to the semiconductor device of the present embodiment, the upper portion of the storage node contact plug 142 extends in the second direction and has a substantially vertical side face B so that the upper portion of the storage node contact plug 142 has a uniform width C regardless of a difference of polished amounts, during a planarization process. As a result, a sufficient overlap margin between the storage node electrode 144 and the storage node contact plug 142 may be ensured.

FIGS. 4 to 10 are plan views and FIGS. 11 to 30 are cross-sectional views, together illustrating a method of manufacturing the semiconductor device in FIG. 3. FIGS. 11, 13, 15, 17, 19, 21, 23, 25, 27 and 29 are cross-sectional views taken along line I-I' in FIG. 3; and FIGS. 12, 14, 16, 18, 20, 22, 24, 26, 28 and 30 are cross-sectional views taken along line II-II' in FIG. 3.

Figure 4:
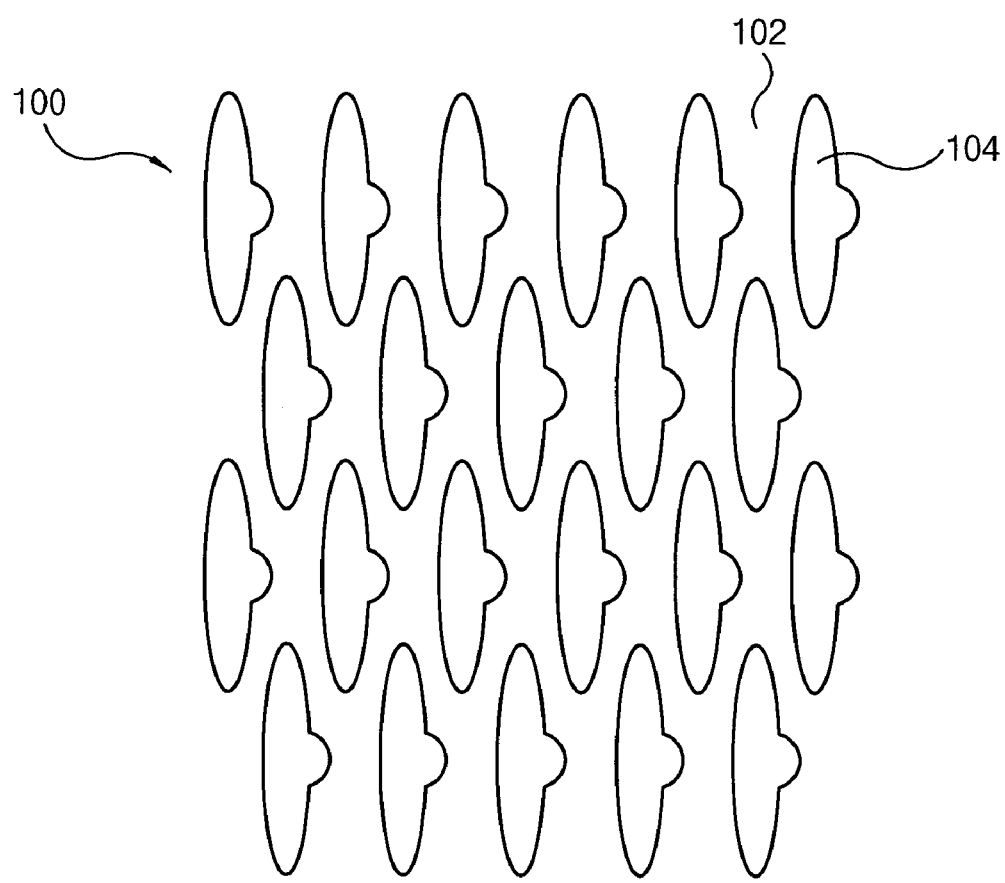
FIGS. 4 to 10 are plan views illustrating a method of manufacturing the semiconductor device in FIG. 3.

Referring to FIG. 4, the isolation layers 102 are formed in the semiconductor substrate 100 by a shallow trench isolation (STI) process to define the active regions 104 having a T shape. Also, to position the active regions 104 in a restricted region, the active regions 104 are arranged in a zigzag pattern.

Figure 5:
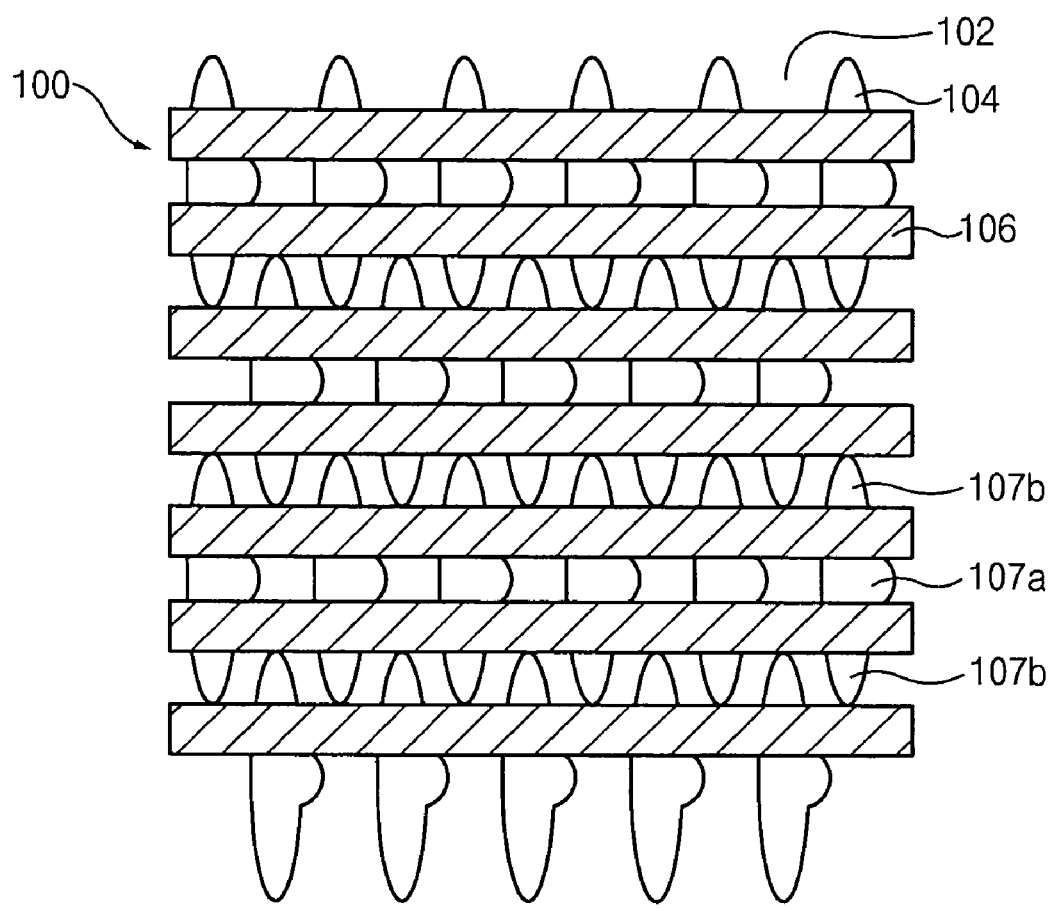

Referring to FIG. 5, the word line structures 106 are formed on the semiconductor substrate 100. The word line structures 106 extend in the first direction traversing the active regions 104. The word line structures 106 include the gate insulating layer pattern, the gate electrode pattern and the hard mask pattern sequentially stacked. Here, one active region 104 includes two word line structures 106 arranged in parallel to each other so that two unit cells are formed in one active region 104.

Impurities are implanted into the semiconductor substrate 100 using the word line structures 106 as an ion implantation mask to form the source regions 107a and the drain regions 107b in the active regions 104 at both sides of the word line structures 106. The source regions 107a positioned in a central portion of the active regions 104 correspond to regions to which bit line structures are electrically connected. The drain regions 107b positioned at both sides of the active regions 104 correspond to regions to which a storage node electrode is electrically connected.

Figure 6:
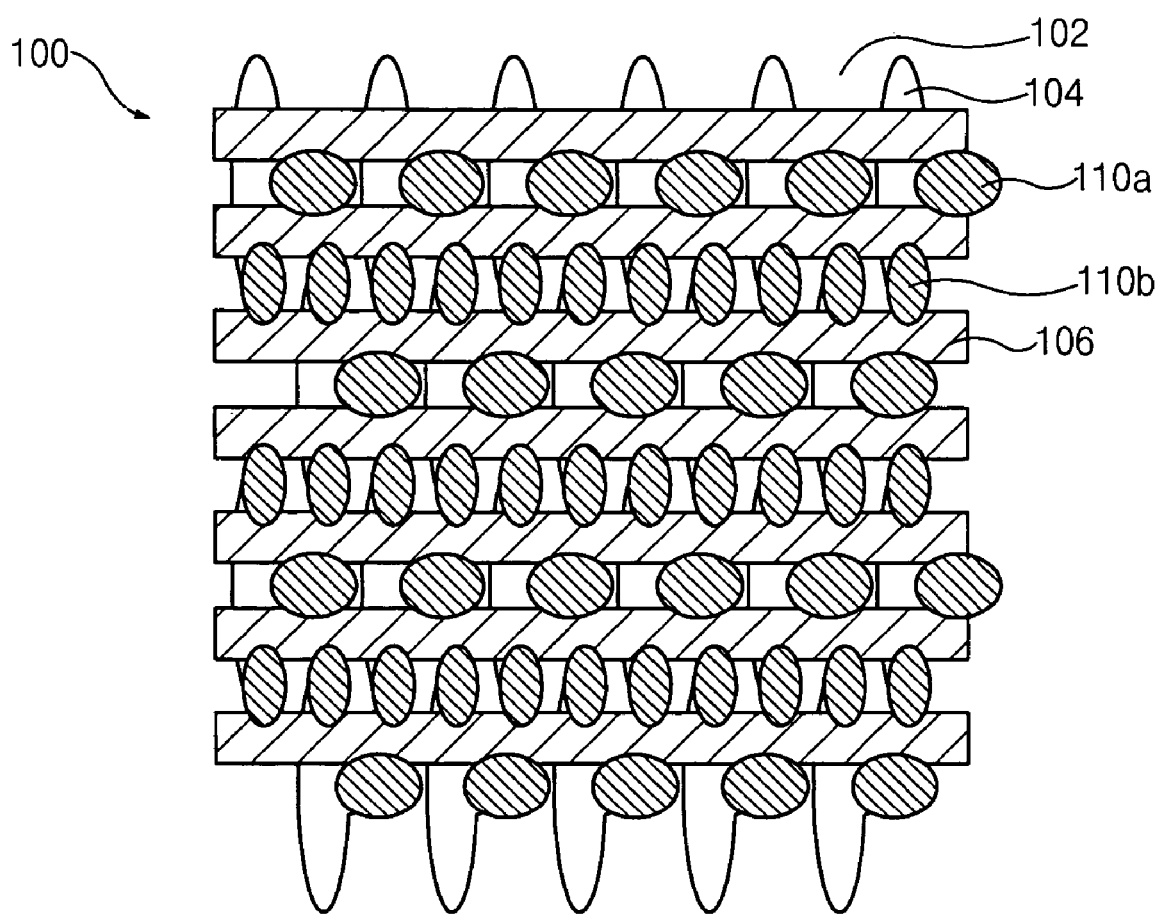

Referring to FIG. 6, a first insulating interlayer (not shown) covers the word line structures 106. The first insulating interlayer is partially etched to form self-aligned contact holes exposing the source region 107a and the drain region 107b. The contact holes are filled with doped polysilicon to form the first contact pads 110a and the second contact pads 110b electrically connected to the source region 107a and the drain region 107b, respectively.

Figure 7:
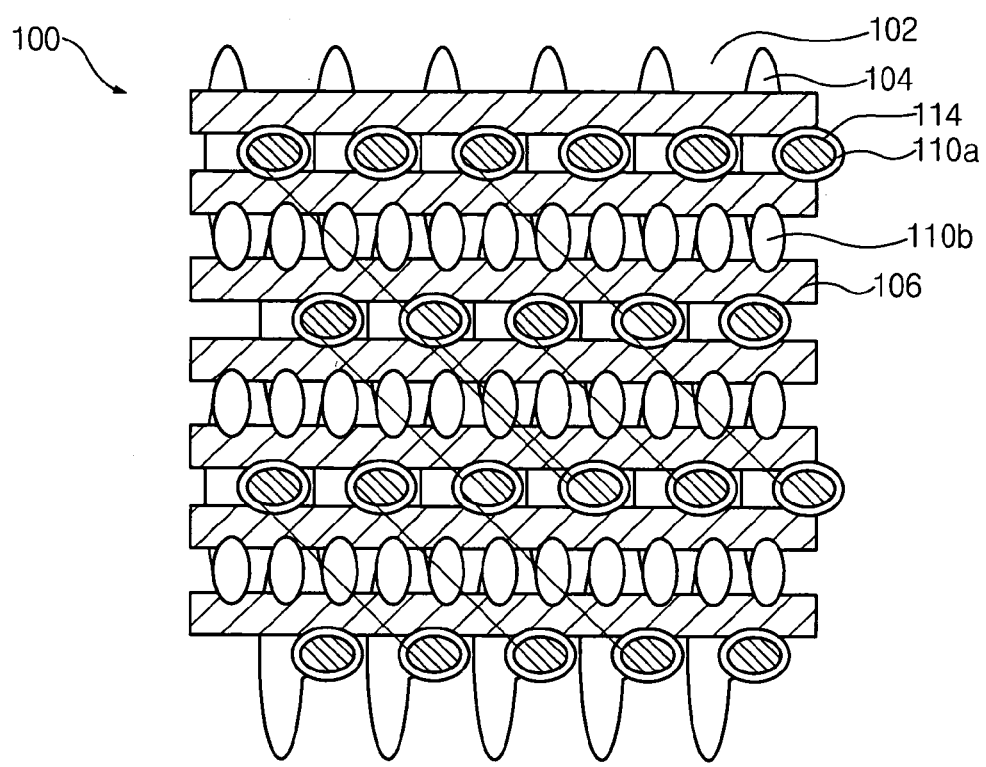

Referring to FIG. 7, a second insulating interlayer (not shown) is formed on the first insulating interlayer including the first and second contact pads 110a and 110b. The second insulating interlayer is partially etched to form bit line contact holes 114 exposing the first contact pads 110a.

Figure 8:
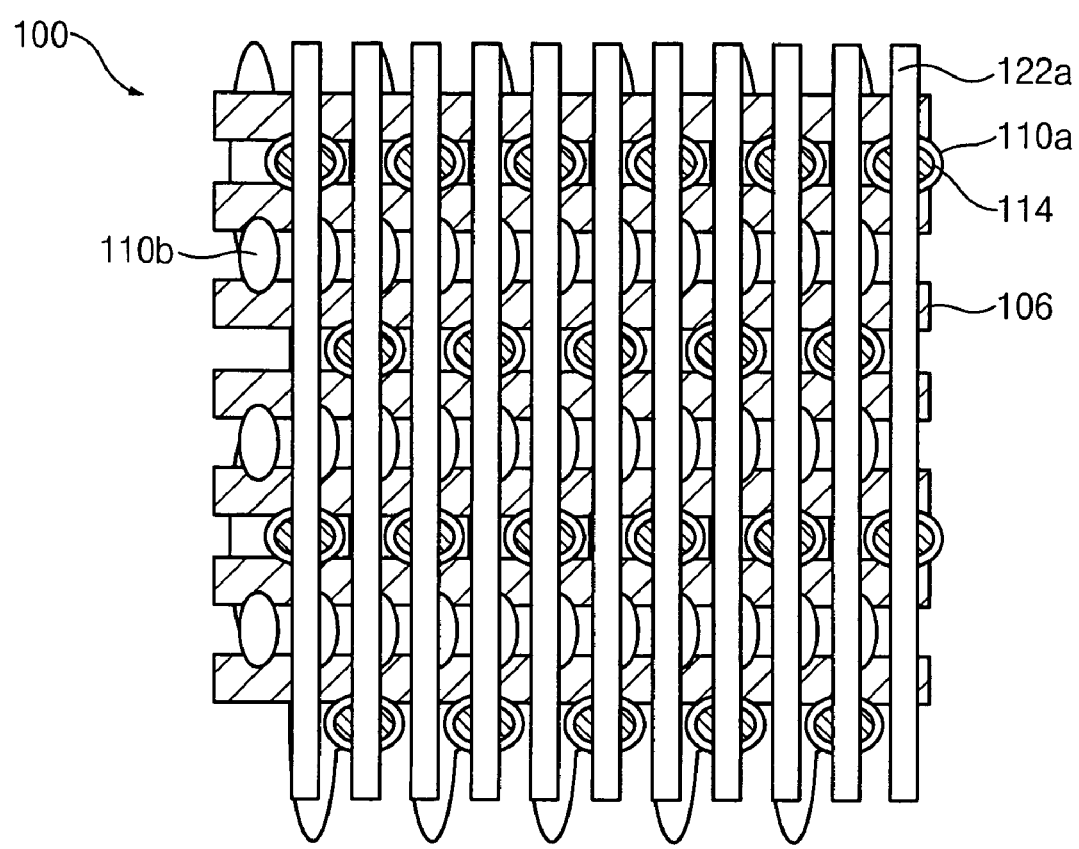

Referring to FIG. 8, the bit line structures 122a are formed on the second insulating interlayer to fill the bit line contact holes 114. The bit line structures 122a are electrically connected to the first contact pad 110a, and are electrically isolated from the word line structures 106, and extend in the second direction. The bit line structures 122a include the barrier metal layer pattern, the tungsten layer pattern, and the capping layer pattern sequentially stacked. A spacer (not shown) is formed on sidewalls of the barrier metal layer pattern, the tungsten layer pattern, and the capping layer pattern.

Figure 9:
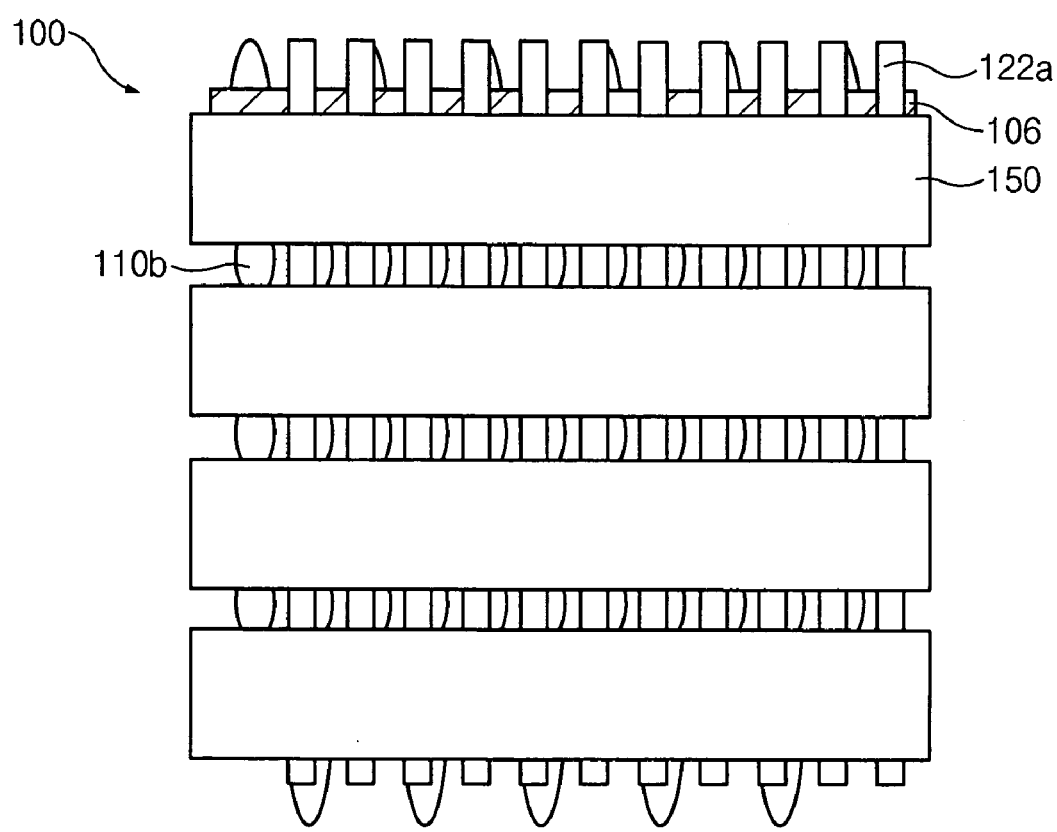

Referring to FIG. 9, the insulation layer structure (not shown) is formed on the second insulating interlayer having the bit line structures 122a. The insulation layer structure includes the third insulating interlayer pattern, the etching stop layer pattern, and the fourth insulating interlayer pattern. A mask pattern 150 including polysilicon is formed on the insulation layer structure. The mask pattern 150 covers the first contact pad 110a, partially exposes the second contact pad 110b, and extends in the first direction.

Figure 10:
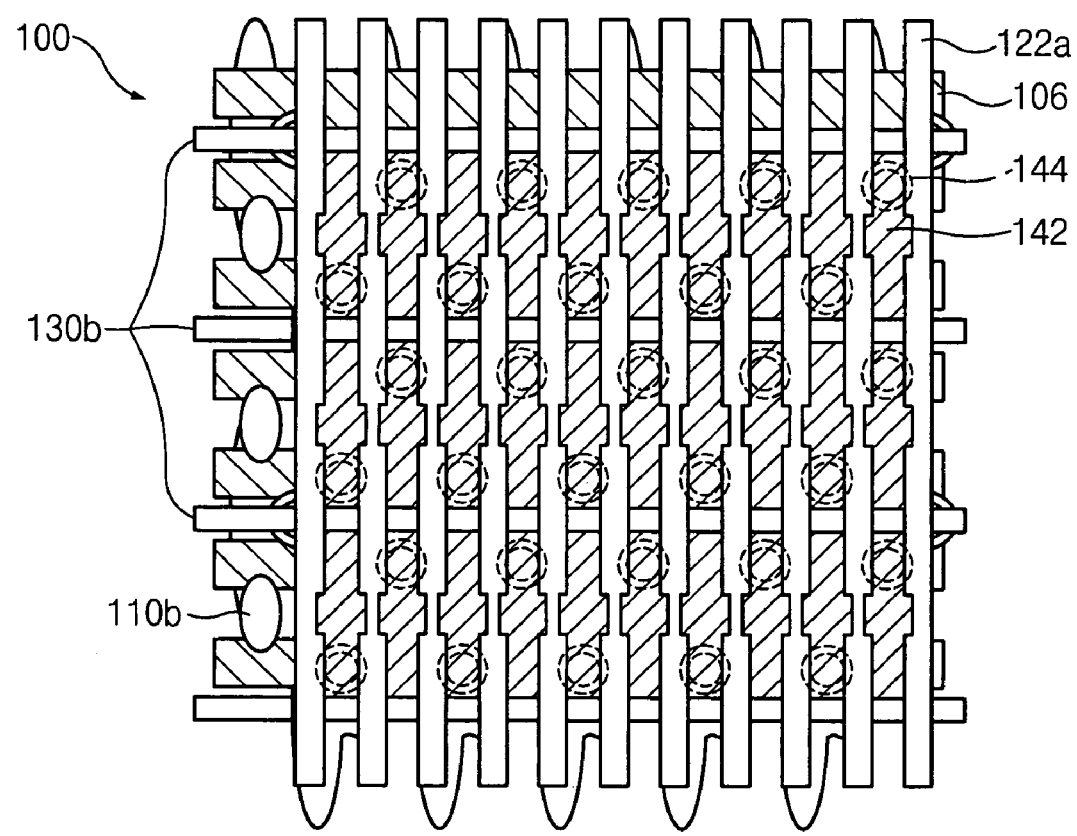

Referring to FIG. 10, the insulation layer structure is partially etched using the mask pattern as an etching mask to form the storage node contact holes (not shown) having the lower portion and the upper portion wider than the lower portion. The upper portion of the storage node contact holes extends in the second direction and has the vertical side face substantially perpendicular to the first direction. The storage node contact holes are filled with a conductive material to form the storage contact plugs 142.

The storage node electrodes 144 having a cylindrical shape are formed on the storage node contact plugs 142. The storage node electrodes 144 may have a concave shape or a cylindrical shape. The storage node electrodes 144 correspond to the storage node contact plugs 142. Also, the storage node electrodes 144 are arranged in a zigzag pattern on the respective storage node contact plugs 142. In particular, a straight line connected between the adjacent storage node electrodes 144 is diagonal to the first and second directions.

A dielectric layer (not shown) and a plate electrode (not shown) are sequentially formed on the storage node electrode 144 to complete a capacitor (not shown).

Figure 11:
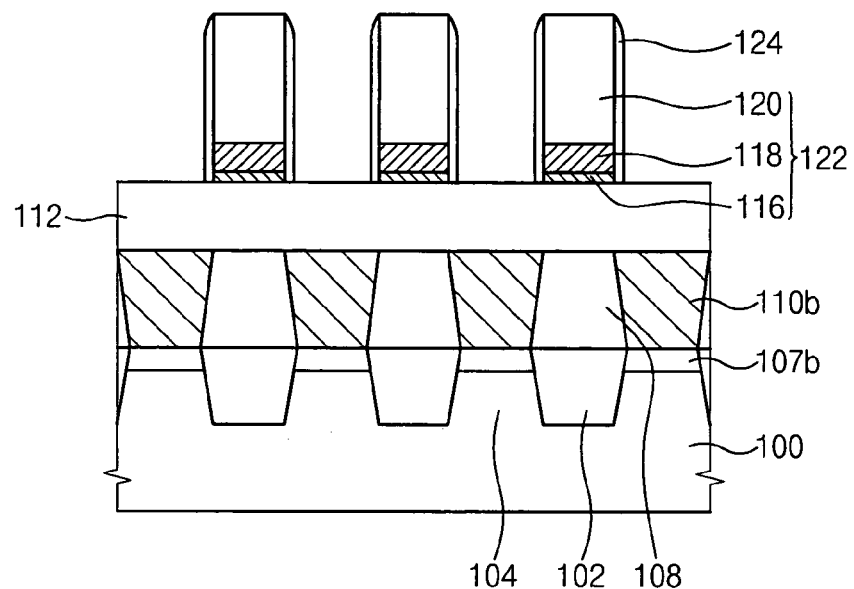
FIGS. 11 to 30 are cross-sectional views illustrating a method of manufacturing the semiconductor device in FIG. 3.
Figure 12:
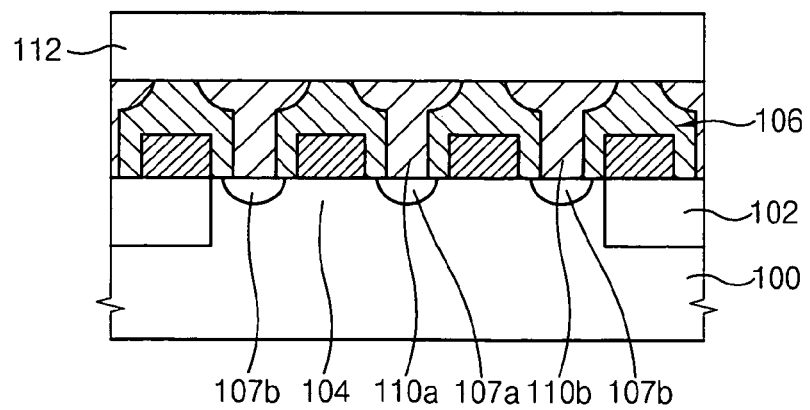

Meanwhile, referring to FIGS. 11 and 12, a buffer oxide layer (not shown) is formed on the semiconductor substrate 100. The buffer oxide layer functions to relieve stresses generated in forming a silicon nitride layer (not shown). The silicon nitride layer is formed on the buffer oxide layer. The silicon nitride layer is dry etched to form a silicon nitride layer pattern (not shown). The buffer oxide layer is dry etched using the silicon nitride layer pattern as an etching mask to form a buffer oxide layer pattern (not shown). The semiconductor substrate 100 is etched using the silicon nitride layer pattern as an etching mask to form a trench (not shown) at a surface portion of the semiconductor substrate 100. The trench is filled with a silicon oxide layer (not shown). The silicon oxide layer is planarized to expose the silicon nitride layer pattern. The silicon nitride layer pattern and the buffer oxide layer pattern are removed by a wet etching process to complete the isolation layers 102 defining the active regions 104 of the semiconductor substrate 100.

A surface of the active regions 104 is thermally oxidized to form a thin gate insulation layer (not shown). A gate electrode layer (not shown) and a hard mask layer (not shown) are sequentially formed on the gate insulation layer. The hard mask layer, the gate electrode layer and the gate insulation layer are patterned to form the word line structures 106.

The impurities are implanted into the active regions 104 at both sides of the word line structures 106 using the word line structures 106 as an ion implantation mask to form the source regions 107a and the drain regions 107b.

The first insulating interlayer 108 covers the word line structures 106. The first insulating interlayer 108 is partially etched to form the self-aligned contact holes exposing the source region 107a and the drain region 107b. The contact holes are filled with the doped polysilicon layer. The doped polysilicon layer is planarized until the word line structures 106 are exposed to form the first contact pads 110a and the second contact pads 110b electrically connected to the source region 107a and the drain region 107b, respectively.

The second insulating interlayer 112 is formed on the first insulating interlayer 108 including the first and second contact pads 110a and 110b. The second insulating interlayer 112 is partially etched to form bit line contact holes (not shown) exposing the first contact pads 110a.

A barrier metal layer (not shown) is formed in the bit line contact holes and on the second insulating interlayer 112. Examples of the barrier metal layer are a titanium layer, a titanium nitride layer, a tantalum layer, a tantalum nitride layer, a combination thereof, etc. A tungsten layer (not shown) is formed on the barrier metal layer. A capping layer (not shown) including silicon nitride is formed on the tungsten layer.

Here, the capping layer functions as a hard mask in etching the tungsten layer and a protection layer for protecting the tungsten layer in forming a self-aligned contact. Thus, for a sufficient thickness of the capping layer to remain after completing the process for etching the tungsten layer and the process for forming the self-aligned contact, the capping layer is relatively thick. In the present embodiment, the capping layer has a thickness of no less than two times that of the tungsten layer.

A first photoresist pattern (not shown) is formed on the capping layer. The capping layer is partially etched using the first photoresist pattern as an etching mask to form the capping layer pattern 120. The first photoresist pattern is then removed. The tungsten layer and the barrier metal layer are anisotropically etched using the capping layer pattern 120 as an etching mask to form the bit line structures 122 including the barrier layer pattern 116, the tungsten layer pattern 118 and the capping layer pattern 120.

The spacer 124 is formed on the sidewalls of the barrier layer pattern 116, the tungsten layer pattern 118, and the capping layer pattern 120.

Figure 13:
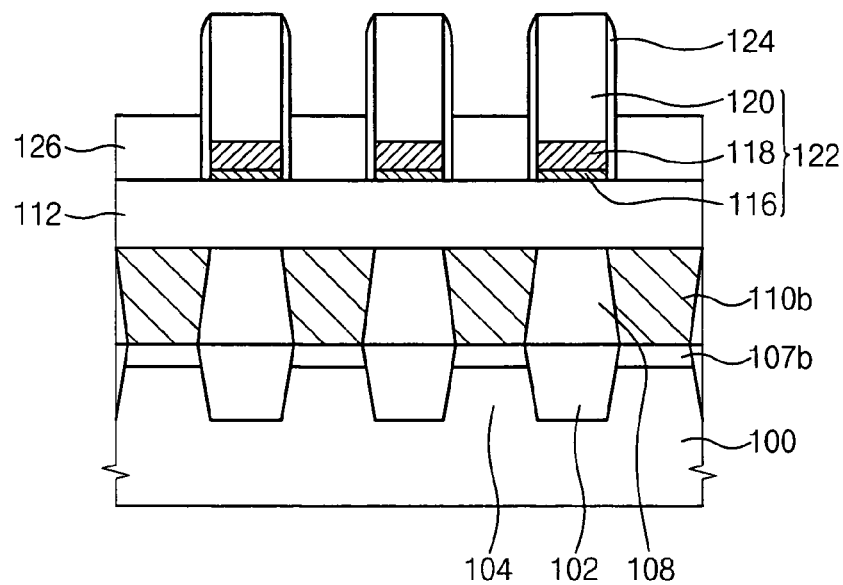
Figure 14:
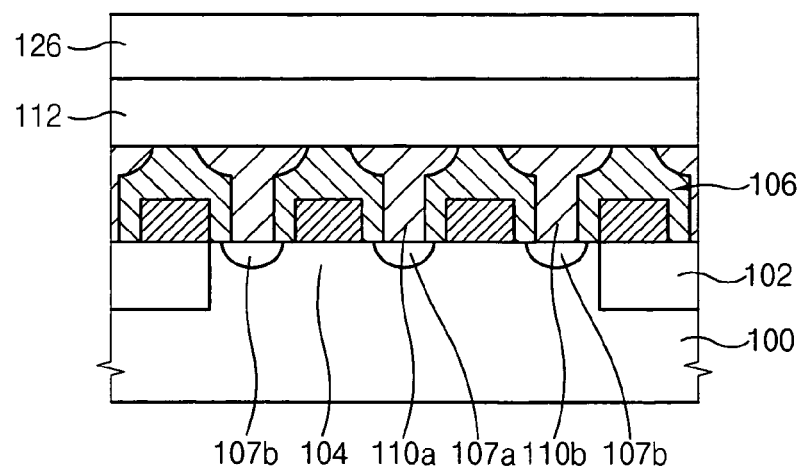

Referring to FIGS. 13 and 14, a third insulating interlayer (not shown) is formed on the second insulating interlayer 112 to fill a space between the bit line structures 122. Here, the third insulating interlayer may include an insulation material having a dielectric constant lower than that of silicon nitride, such as silicon oxide. The third insulating interlayer is planarized by a CMP process to expose the capping layer pattern 120. Here, when the third insulating interlayer is planarized by the CMP process, a height of the remaining third insulating interlayer may be accurately measured.

The planarized third insulating interlayer is wet etched to form the third insulating interlayer 126, partially filling a lower portion of the space between the bit line structures 122. Here, the third insulating interlayer 126 has an upper face higher than that of the tungsten layer pattern 118.

Figure 15:
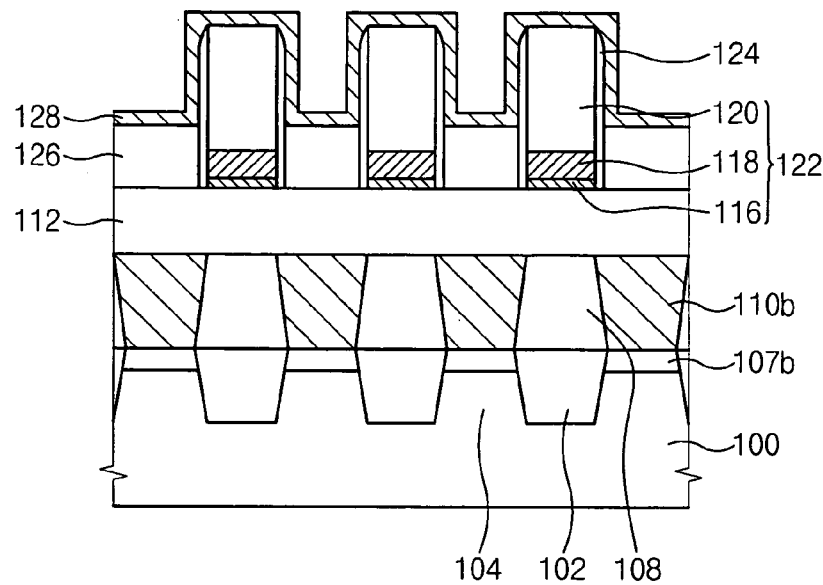
Figure 16:
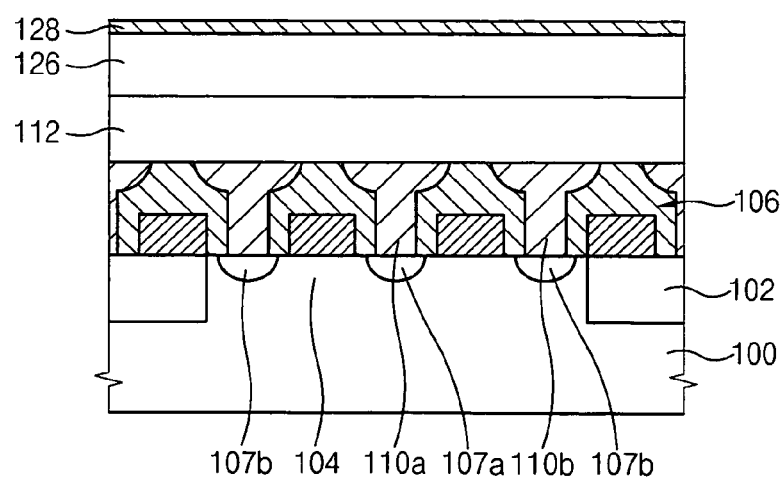

Referring to FIGS. 15 and 16, the etching stop layer 128 is formed on the third insulating interlayer 126 and the bit line structures 122. The etching stop layer 128 may include a material having an etching selectivity with respect to the third insulating interlayer 126, such as silicon nitride.

Figure 17:
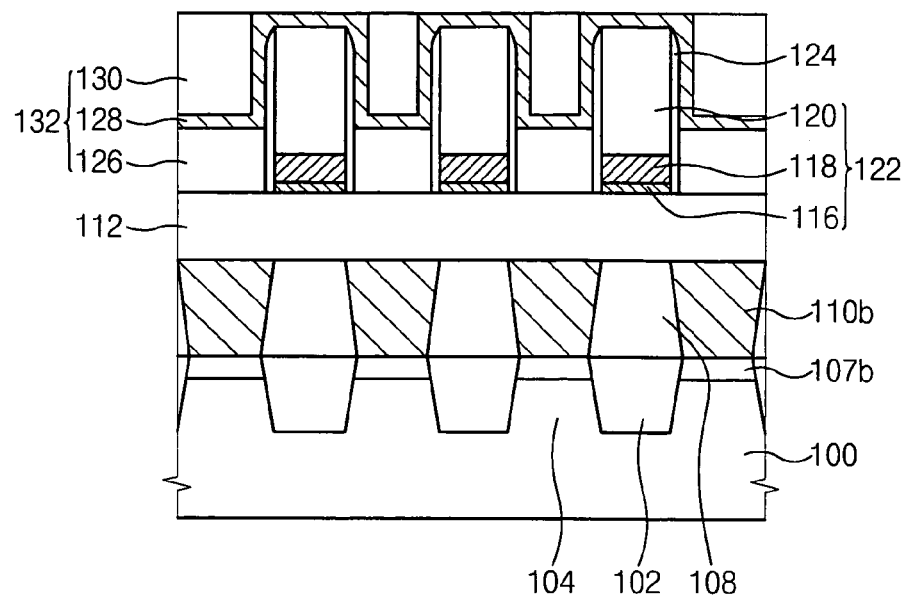
Figure 18:
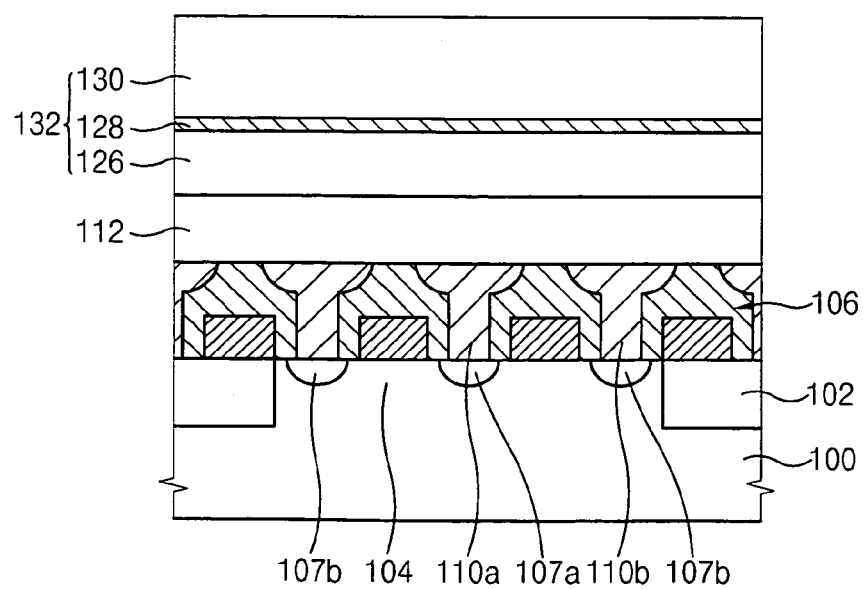

Referring to FIGS. 17 and 18, a fourth insulating interlayer (not shown) is formed on the etching stop layer 128 to fill the space between the bit line structures 122. The fourth insulating interlayer is planarized by a CMP process until the etching stop layer 128 is exposed, to form the fourth insulating interlayer 130, thereby completing the insulation layer structure 132, including the third insulating interlayer 126, the etching stop layer 128 and the fourth insulating interlayer 130.

Figure 19:
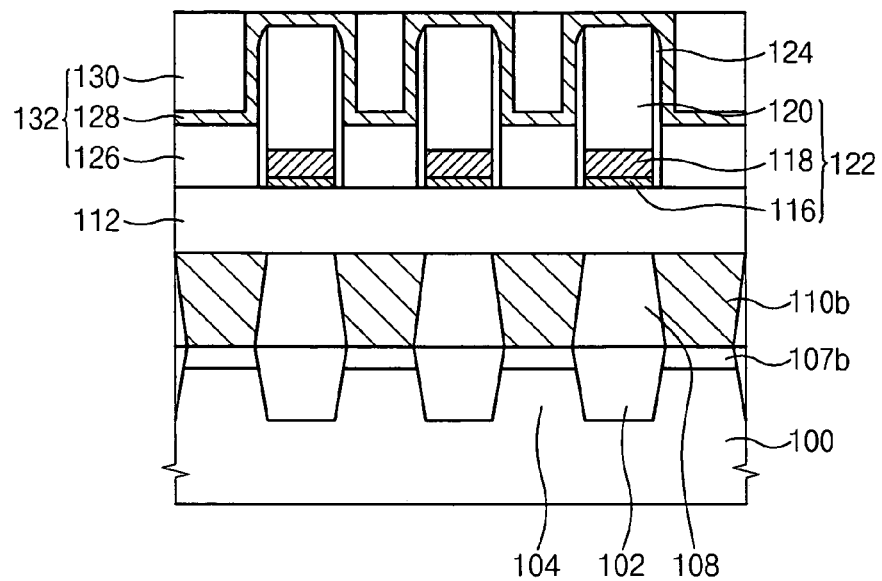
Figure 20:
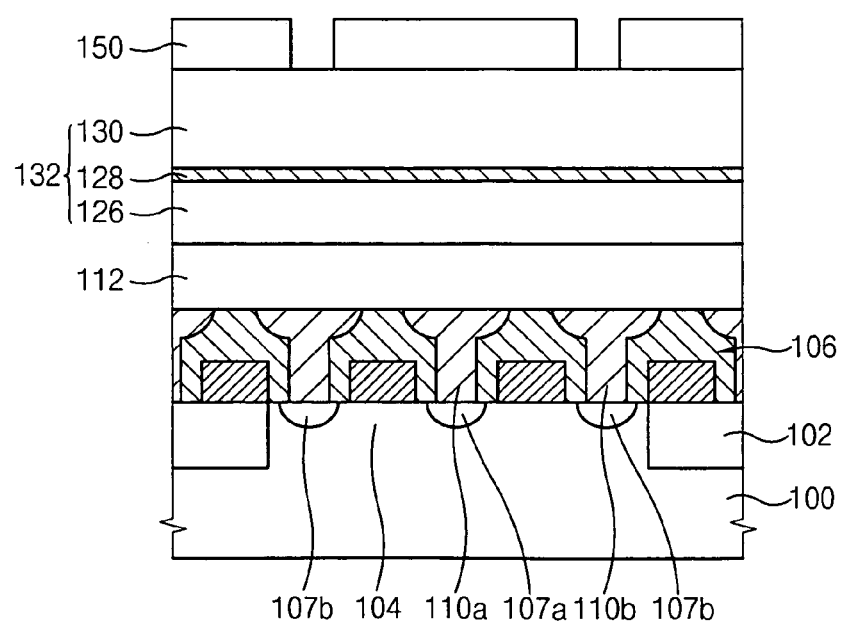

Referring to FIGS. 19 and 20, a mask layer (not shown) including polysilicon is formed on the fourth insulating interlayer 130 and the etching stop layer 128. A photoresist pattern (not shown) covering the first contact pad 110a and exposing the second contact pad 110b is formed on the mask layer. The mask layer is etched using the photoresist pattern as an etching mask to form the mask pattern 150. The photoresist pattern is then removed by a stripping process and/or an ashing process.

Figure 21:
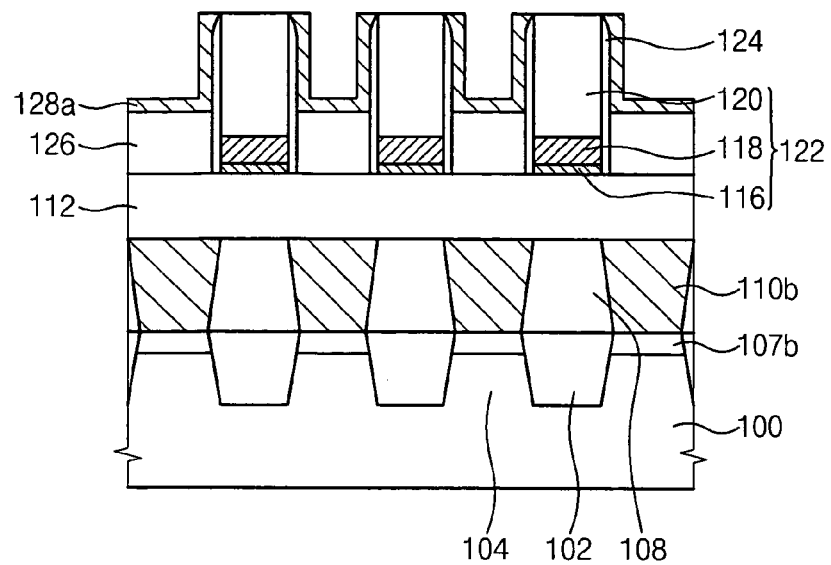
Figure 22:
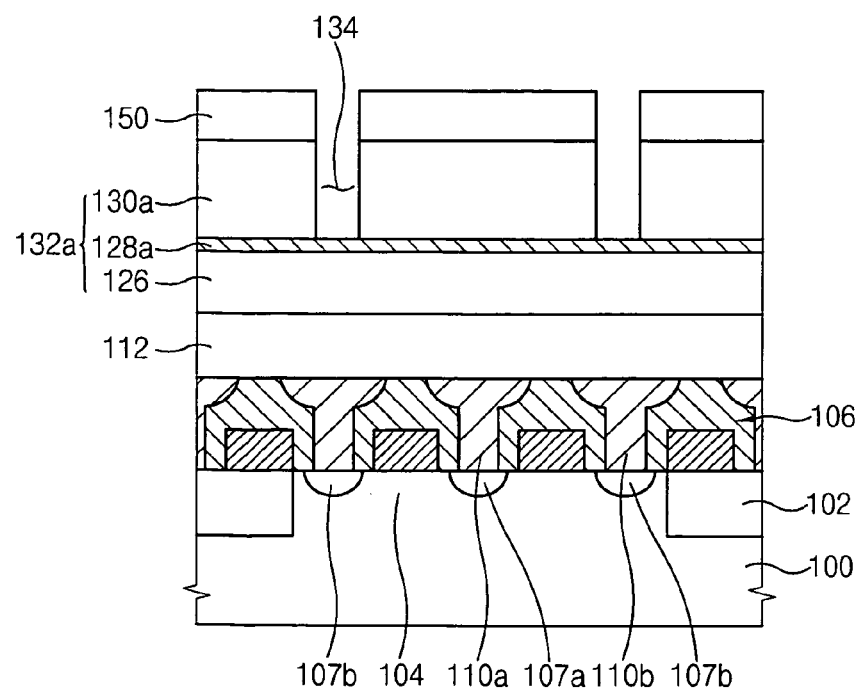

Referring to FIGS. 21 and 22, the fourth insulating interlayer 130 is anisotropically etched using the mask pattern 150 as an etching mask until the etching stop layer 128 is exposed to form the fourth insulating interlayer pattern 130a having a plurality of first openings 134. Simultaneously, the etching stop layer 128 is anisotropically etched to form the preliminary etching stop layer pattern 128a. Since the etching stop layer 128 functions to stop the anisotropic etching process, the first openings 134 may have uniform depths.

Figure 23:
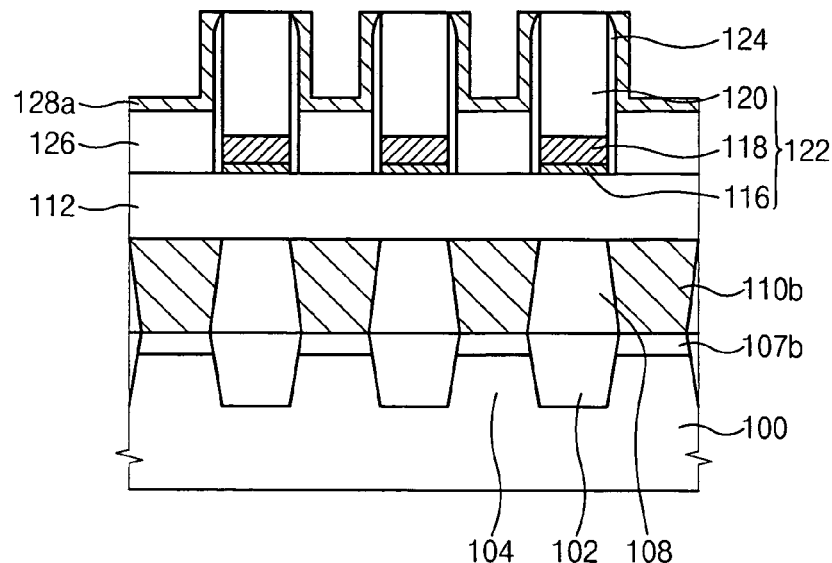
Figure 24:
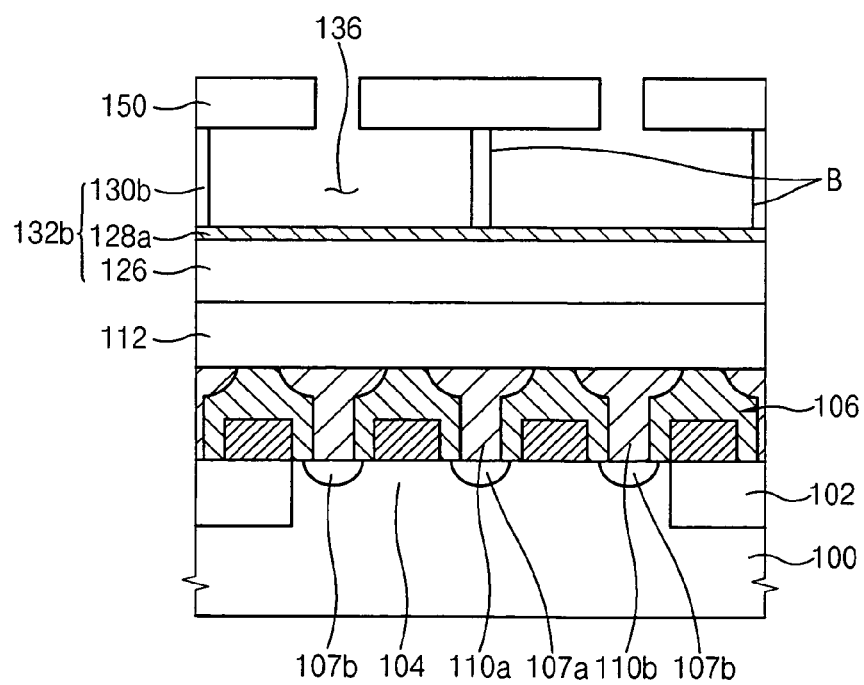

Referring to FIGS. 23 and 24, the fourth insulating interlayer pattern 130a is isotropically etched to form a plurality of second openings 136 having side faces B, and resulting in the formation of fourth insulating interlayer pattern 130b. The side faces B of the second openings 136 horizontally expand in opposite directions and have a vertical profile. The isotropic etching process may include a wet etching process. Since the third insulating interlayer 126 functions to stop the isotropic etching process, recipes of the wet etching process may be readily selected.

Figure 25:
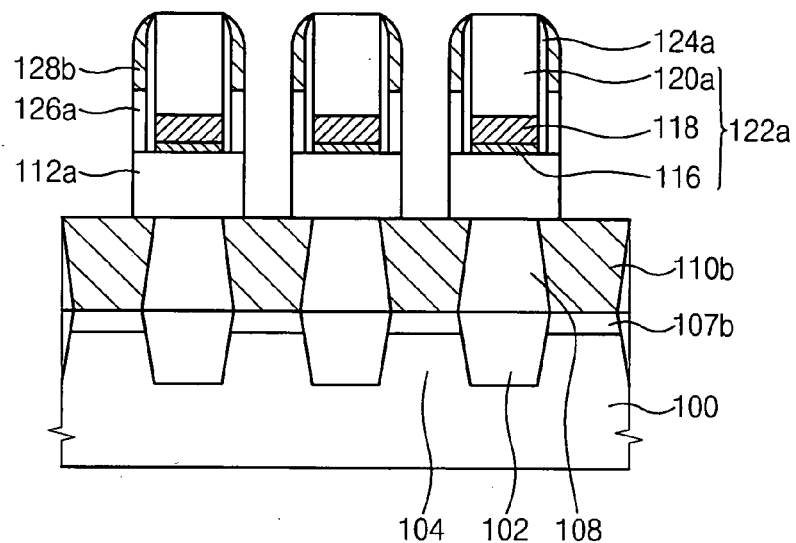
Figure 26:
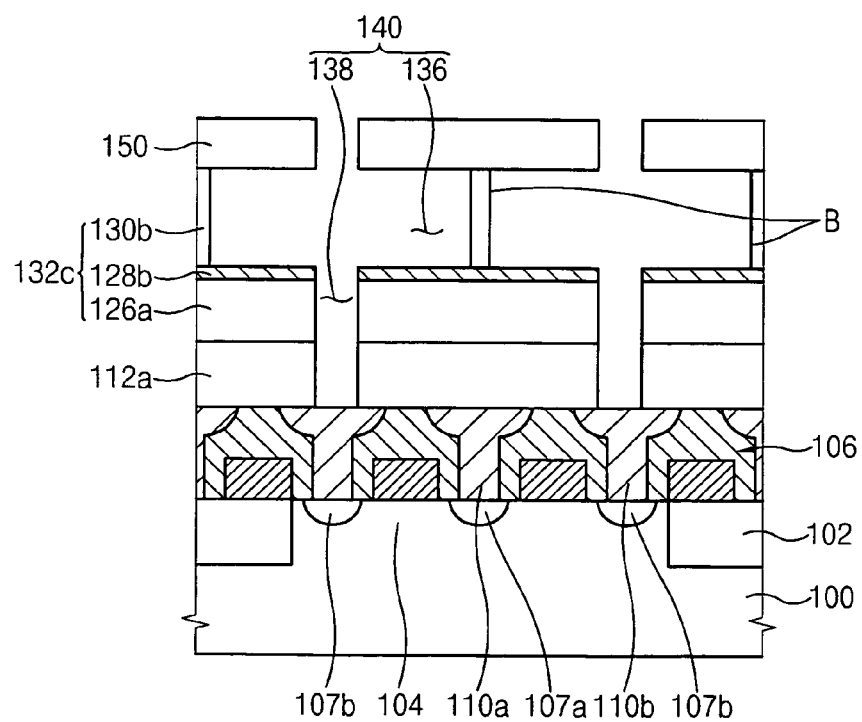

Referring to FIGS. 25 and 26, the etching stop layer 128 exposed through the second openings 136, the third insulating interlayer 126 and the second insulating interlayer 112 are partially etched using the mask pattern as an etching mask to form a plurality of third openings 138. Here, the preliminary etching stop layer pattern 128a, the spacer 124 and the capping layer pattern 120 exposed through the mask pattern 150 are anisotropically etched to self-align the third openings 138 by the preliminary etching stop layer pattern 128a, and to form the etching stop layer pattern 128b and the third insulating interlayer pattern 126a. The second and third openings 136 and 138 are referred to as the storage node contact holes 140.

Figure 27:
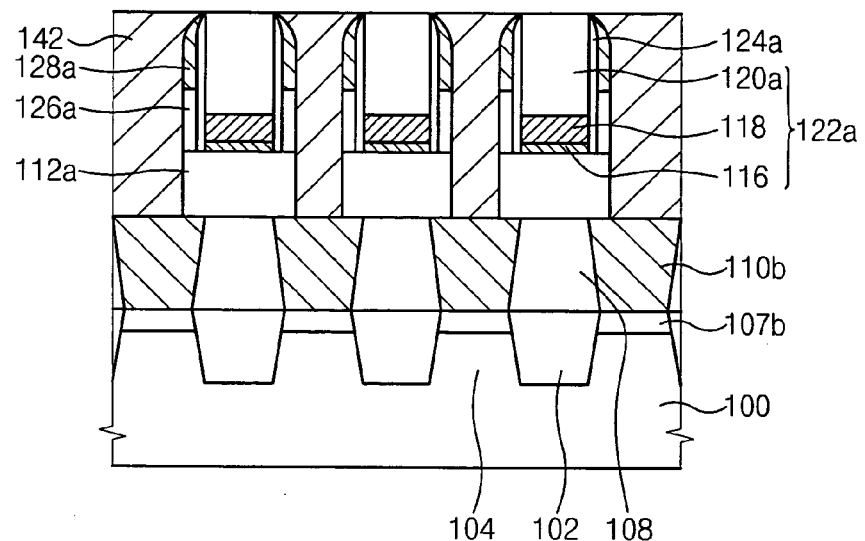
Figure 28:
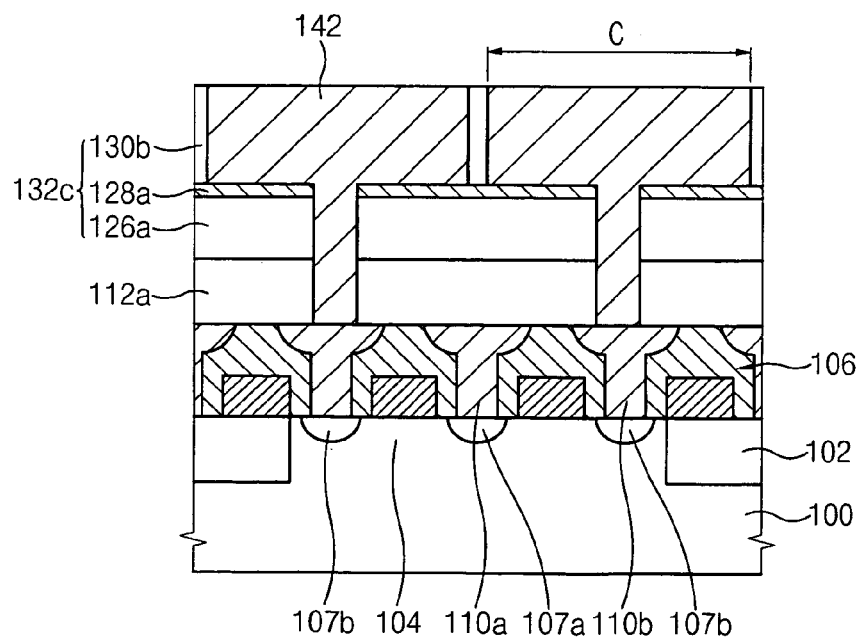

Referring to FIGS. 27 and 28, the storage node contact holes 140 are filled with a conductive material including doped polysilicon. The conductive material and the mask pattern 150 are planarized by a CMP process or an anisotropic etching process to form the storage node contact plugs 142. Here, since the side faces B of the storage node contact holes 140 have vertical profiles, the storage node contact plugs 142 include upper faces having uniform widths C regardless of polished amounts of the CMP process.

Figure 29:
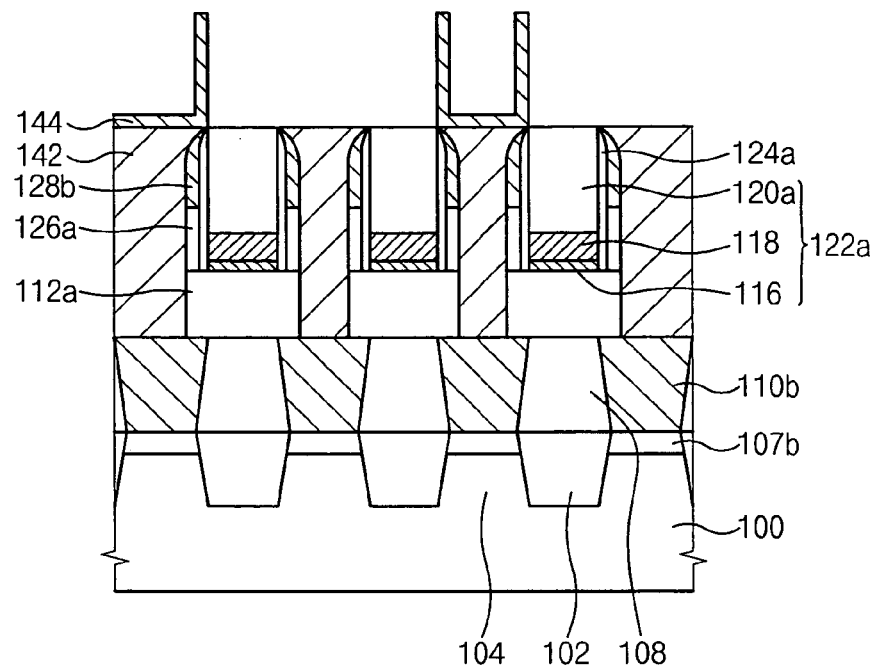
Figure 30:
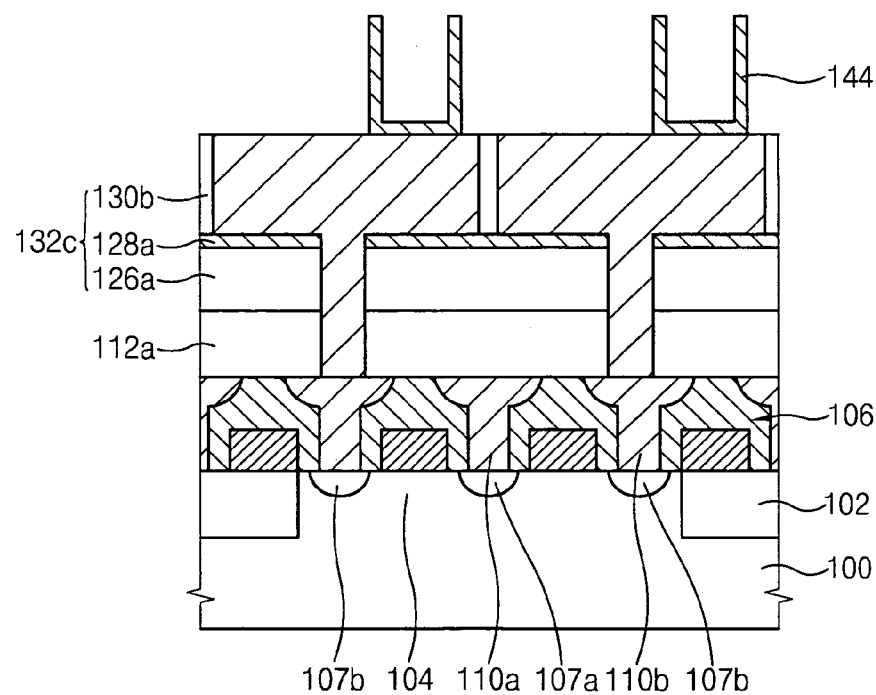

Referring to FIGS. 29 and 30, the storage node electrodes 144 are formed on the storage node contact plugs 142. The storage node electrodes 144 correspond to the storage node contact plugs 142. Also, the storage node electrodes 144 are arranged in a zigzag pattern on the storage node contact plugs 142. In particular, a straight line connected between the adjacent storage node electrodes 144 is diagonal to the first and second directions.

Since the upper faces of the storage node contact plugs 142 have uniform widths C, the overlap margin between the storage node electrodes 144 and the storage node contact plugs 142 may be sufficiently ensured. Also, since the etching stop layer 128 is formed on the bit line structures 122a covered by the mask pattern 150, the likelihood of a short between the bit line structures 122a and the storage node electrodes 144 may be suppressed.

The dielectric layer (not shown) and the plate electrode (not shown) are sequentially formed on the storage node electrode 144 to complete a capacitor (not shown).

Figure 31:
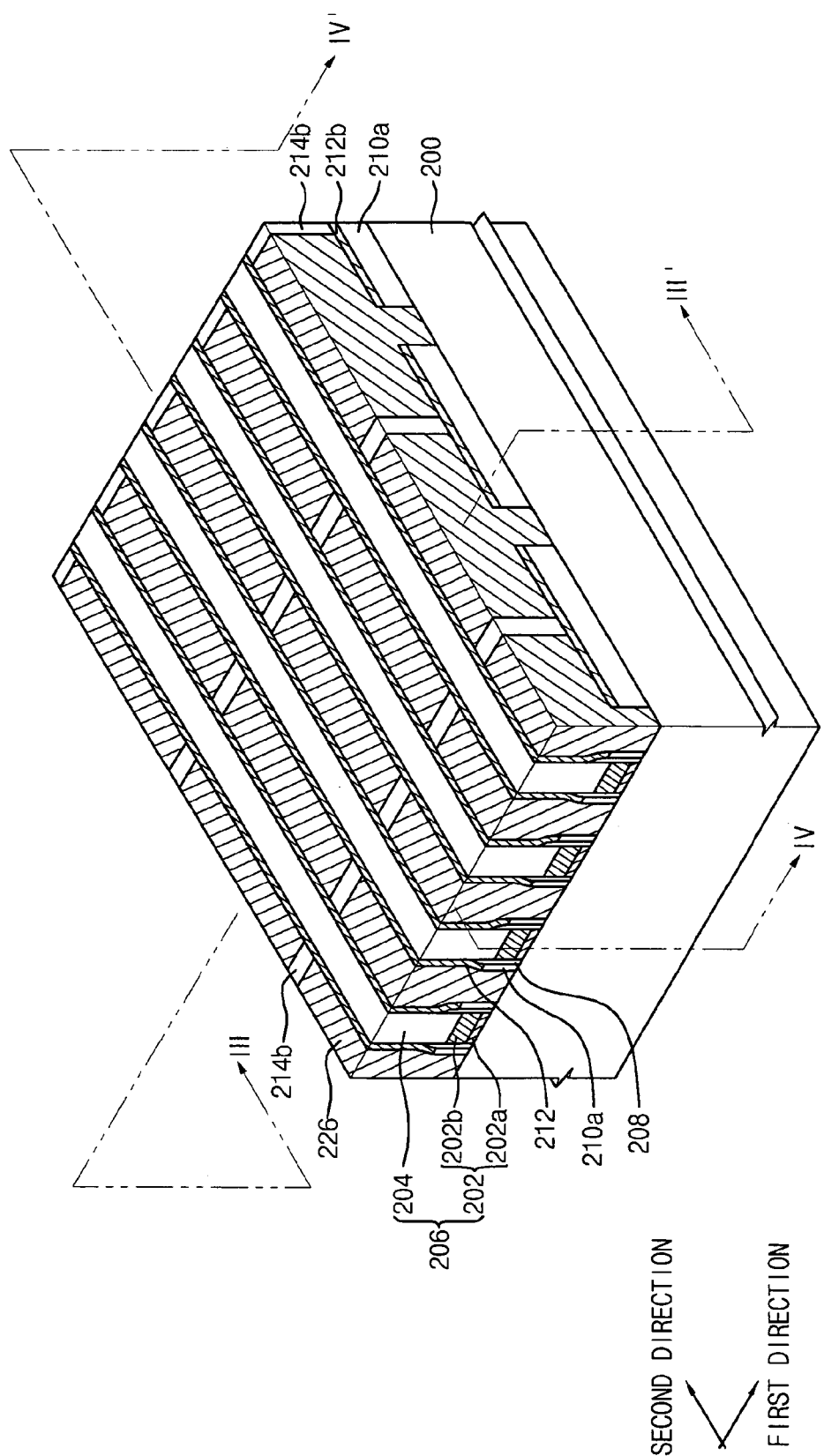
FIG. 31 is a perspective view illustrating a contact plug in accordance with another embodiment of the present invention.

FIG. 31 is a perspective view illustrating a contact plug in accordance with another embodiment of the present invention;

Referring to FIG. 31, linear conductive structures 206 are formed on a semiconductor substrate 200. The conductive structures 206 include a conductive layer pattern 202 and a capping layer pattern 204. The conductive layer pattern 202 includes a barrier metal layer pattern 202a and a metal layer pattern 202b.

A nitride spacer 208 and a first insulating interlayer pattern 210a partially cover the conductive structures 206. Particularly, the first insulating interlayer pattern 210a encloses part of the conductive layer pattern 202.

An etching stop layer pattern 212b is formed on the first insulating interlayer pattern 210a and encloses upper side faces of the conductive structures 206. A second insulating interlayer pattern 214b is formed on the etching stop layer pattern 212b to separate the conductive structures 206 from each other. Contact plugs 226 are formed through the first and second insulating interlayer patterns 210a and 214b between the conductive structures 206. Here, the contact plugs 226 have a lower portion and an upper portion wider than the lower portion. Also, the contact plugs 226, having substantially vertical and planar side faces, have a width longer than its height.

FIGS. 32 to 49 are cross-sectional views illustrating a method of manufacturing the contact plug in FIG. 31. FIGS. 32, 34, 36, 38, 40, 42, 44, 46 and 48 are cross-sectional views taken along line III-III' in FIG. 31, and FIGS. 33, 35, 37, 39, 41, 43, 45, 47 and 49 are cross-sectional views taken along line IV-IV' in FIG. 31.

Figure 32:
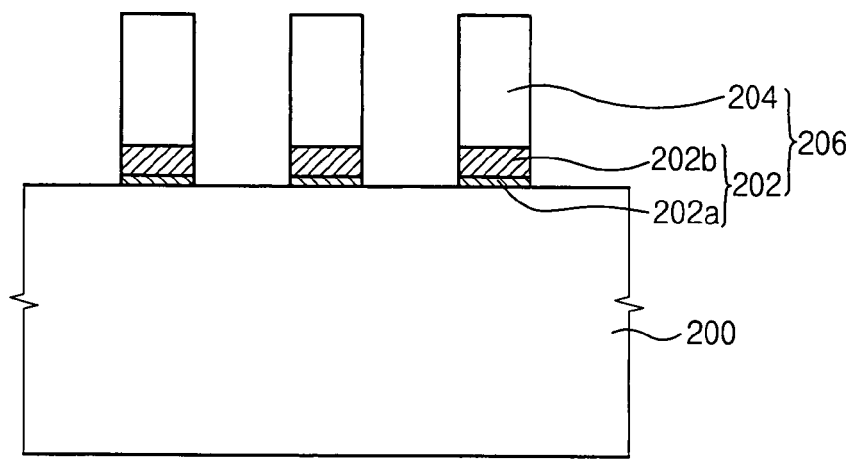
FIGS. 32 to 49 are cross-sectional views illustrating a method of manufacturing the contact plug in FIG. 31.
Figure 33:
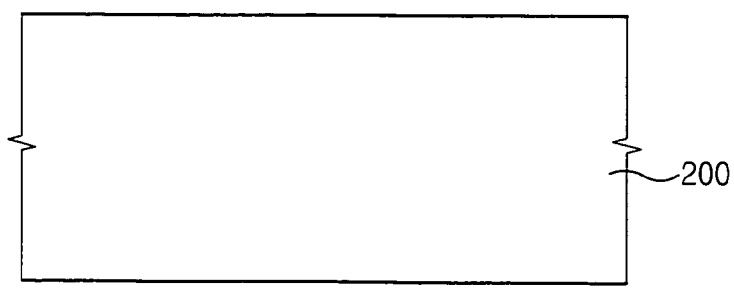

Referring to FIGS. 32 and 33, a conductive layer (not shown) and a capping layer (not shown) are sequentially formed on the semiconductor substrate 200. The conductive layer and the capping layer are patterned to form the linear conductive structures 206, including the conductive layer pattern 202 and the capping layer pattern 204. The conductive layer pattern 202 includes a barrier metal layer pattern 202a and a metal layer pattern 202b. Examples of the barrier metal layer pattern 202a may include a titanium layer, a titanium nitride layer, a combination thereof, etc. An example of the metal layer pattern 202b is a tungsten layer. An example of the capping layer pattern 204 is a silicon nitride layer.

Figure 34:
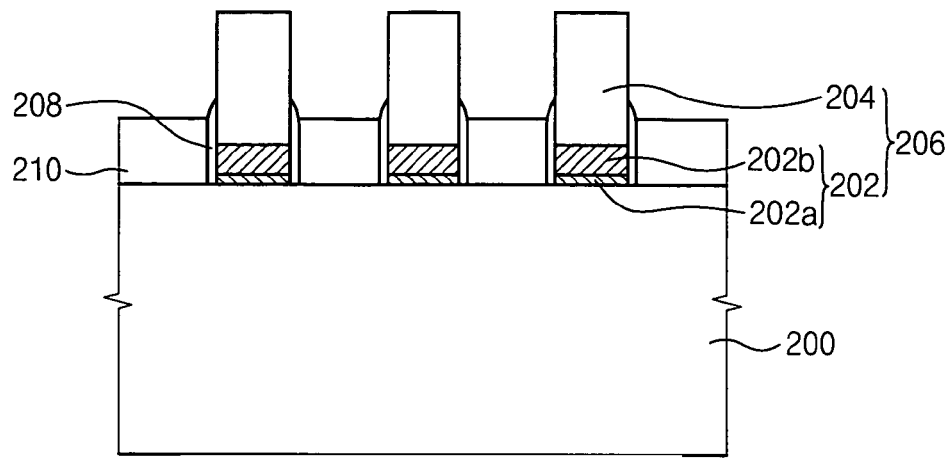
Figure 35:
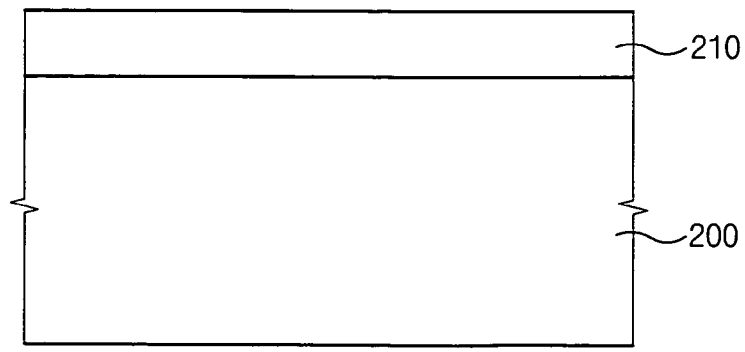

Referring to FIGS. 34 and 35, a silicon nitride layer (not shown) is formed on the semiconductor substrate 200 along the conductive structures 206. The silicon nitride layer is anisotropically etched to form the spacer 208. A first insulating interlayer (not shown) including silicon oxide covers the conductive structures 206 having the spacer 208. The first insulating interlayer is planarized via a CMP process until the conductive structures 206 are exposed. The planarized first insulating interlayer is anisotropically etched to form the first insulating interlayer pattern 210 partially filling a lower space between the conductive structures 206. Here, the first insulating interlayer pattern 210 has an upper face higher than that of the metal layer pattern 202b.

Figure 36:
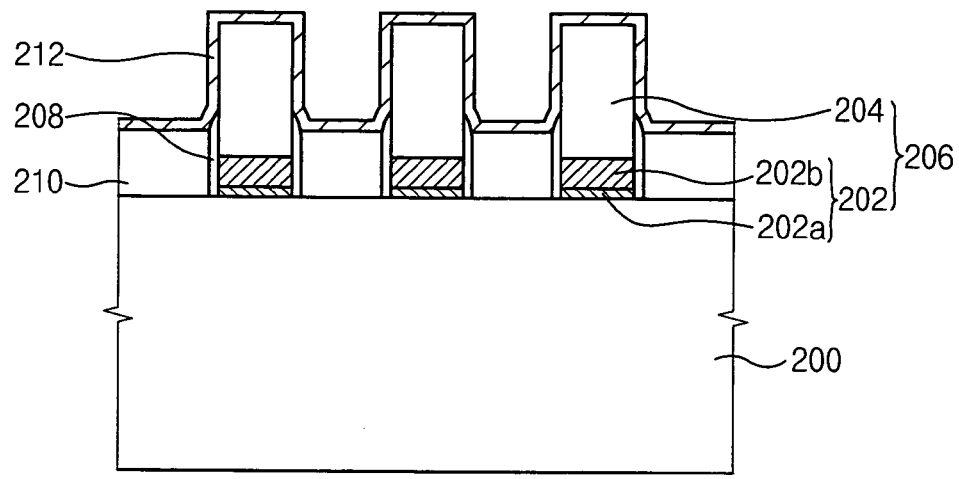
Figure 37:
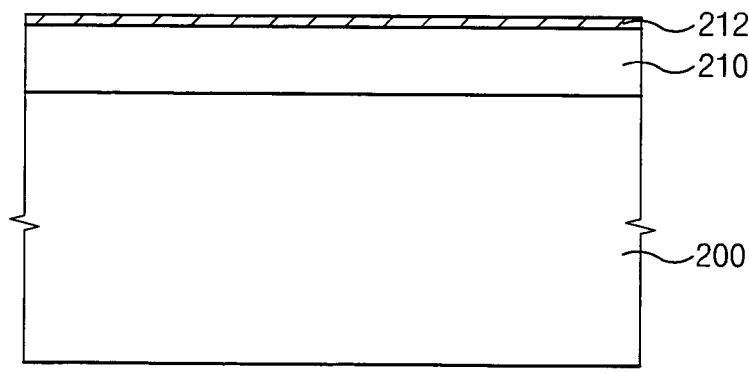

Referring to FIGS. 36 and 37, the etching stop layer 212 including silicon nitride is formed on the conductive structures 206 and the first insulating interlayer pattern 210.

Figure 38:
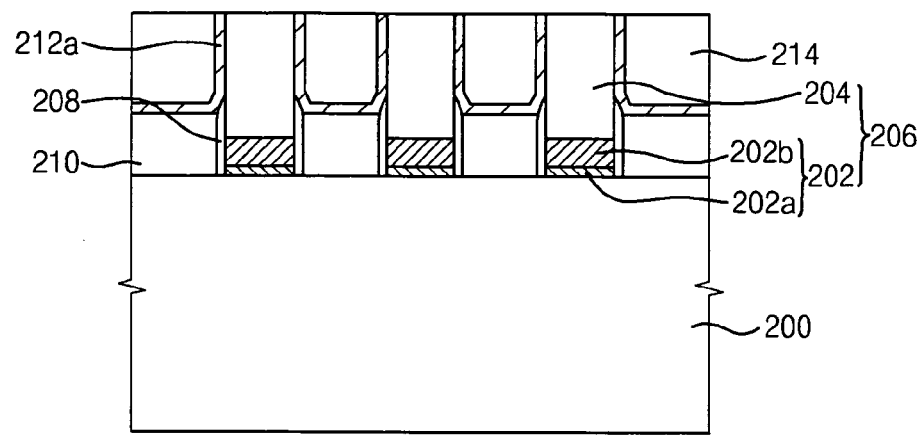
Figure 39:
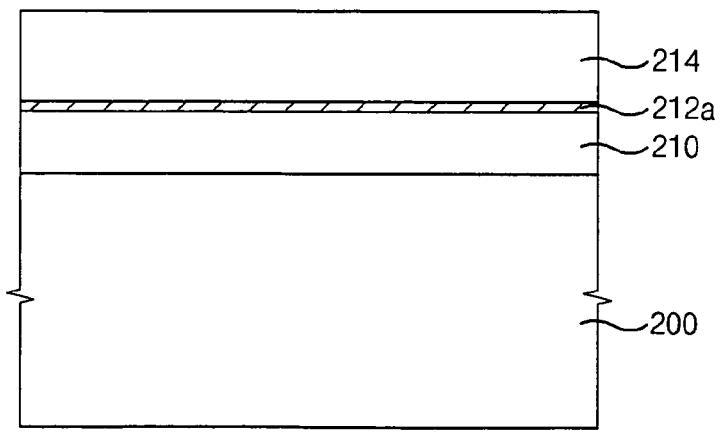

Referring to FIGS. 38 and 39, a second insulating interlayer 214 is formed on the etching stop layer 212 to fill the space between the conductive structures 206. The second insulating interlayer 214 and the etching stop layer 212 are planarized until the conductive structures 206 are exposed to form the preliminary etching stop layer pattern 212a.

Figure 40:
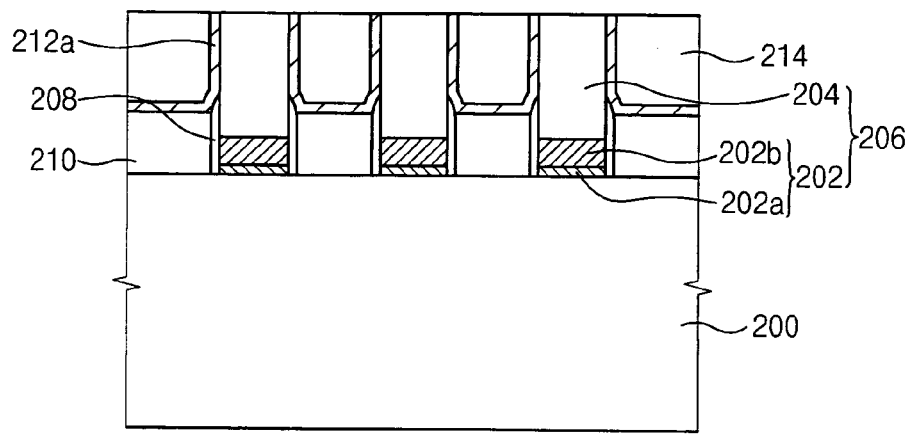
Figure 41:
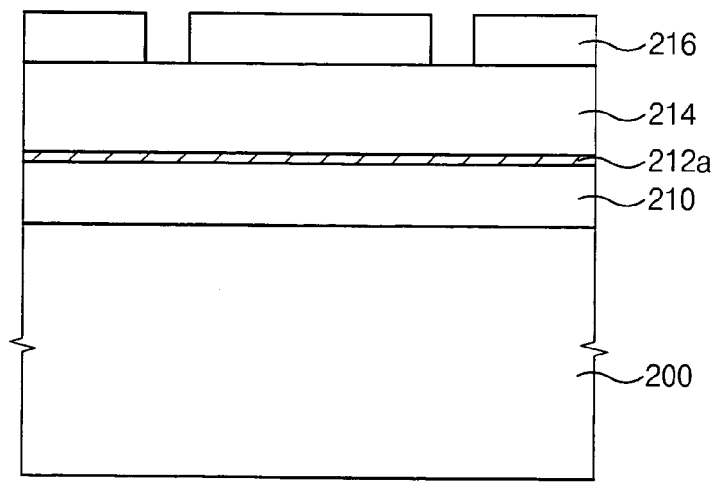

Referring to FIGS. 40 and 41, a mask layer (not shown) including polysilicon is formed on the planarized second insulating interlayer 214. The mask layer is patterned to form a mask pattern 216 for defining contact holes between the conductive structures 206.

Figure 42:
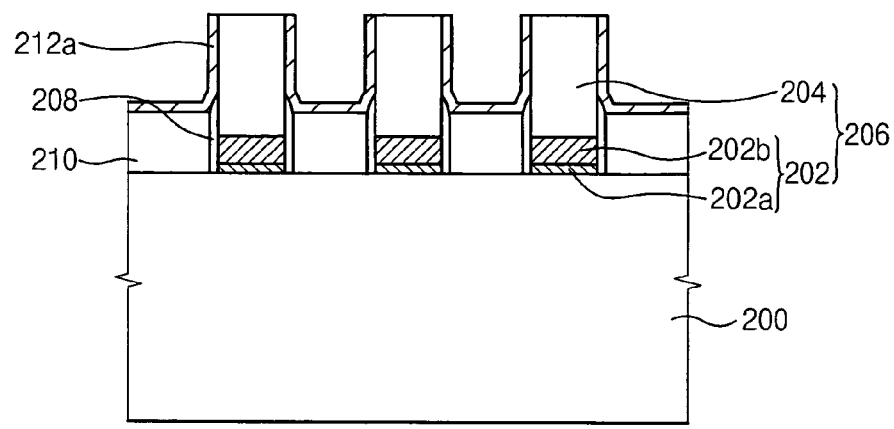
Figure 43:
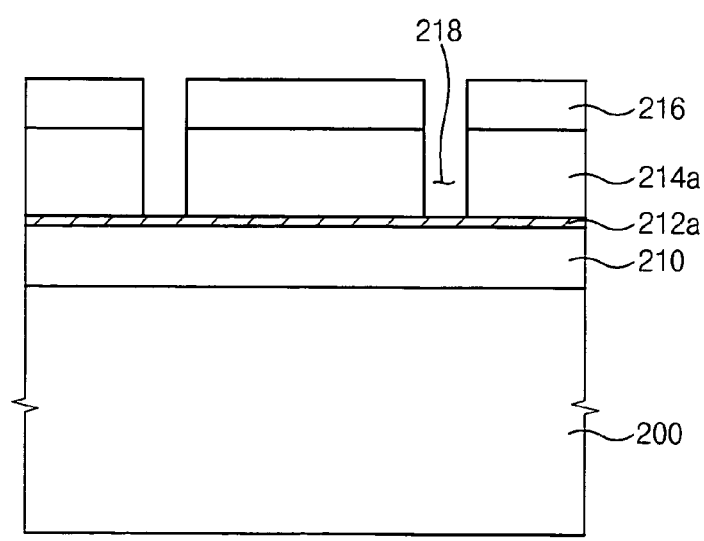

Referring to FIGS. 42 and 43, the second insulating interlayer 214 is anisotropically etched using the mask pattern 216 as an etching mask to form a preliminary second insulating interlayer pattern 214a having first holes 218 that exposes the preliminary etching stop layer pattern 212a.

Figure 44:
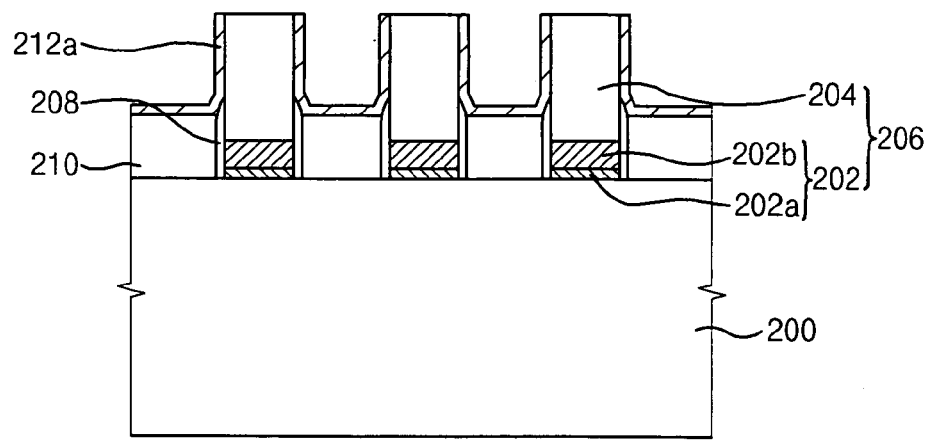
Figure 45:
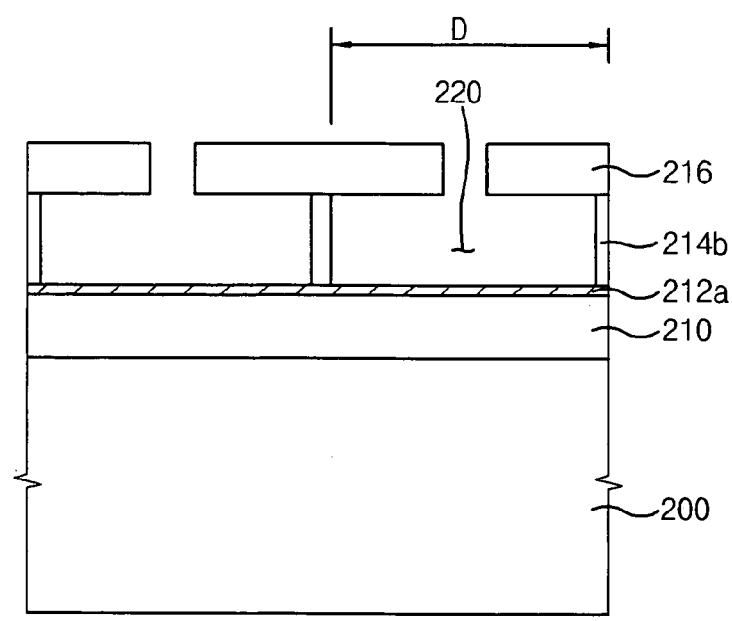

Referring to FIGS. 44 and 45, the preliminary second insulating interlayer pattern 214a exposed through the first hole 218 is partially and isotropically etched by a wet etching process to form the second insulating interlayer pattern 214b having second holes 220 that expand from the first holes 218 in a direction D, shown in FIG. 45. Here, the second insulating interlayer pattern 214b partially remains between the second holes 220.

Figure 46:
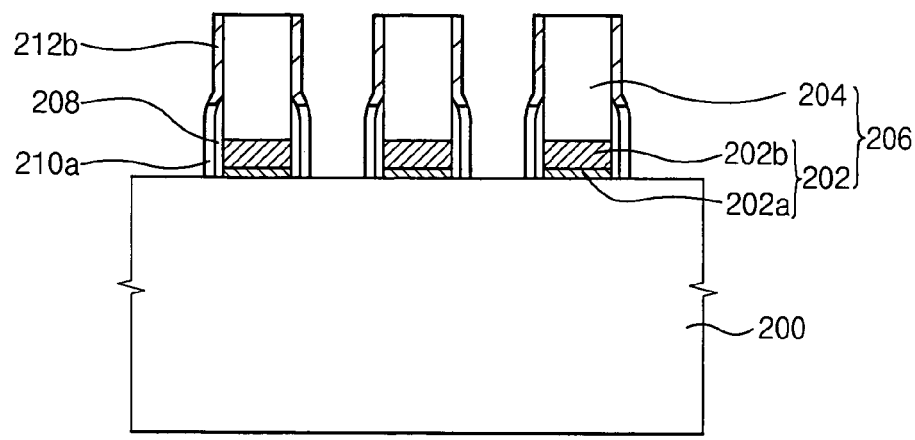
Figure 47:
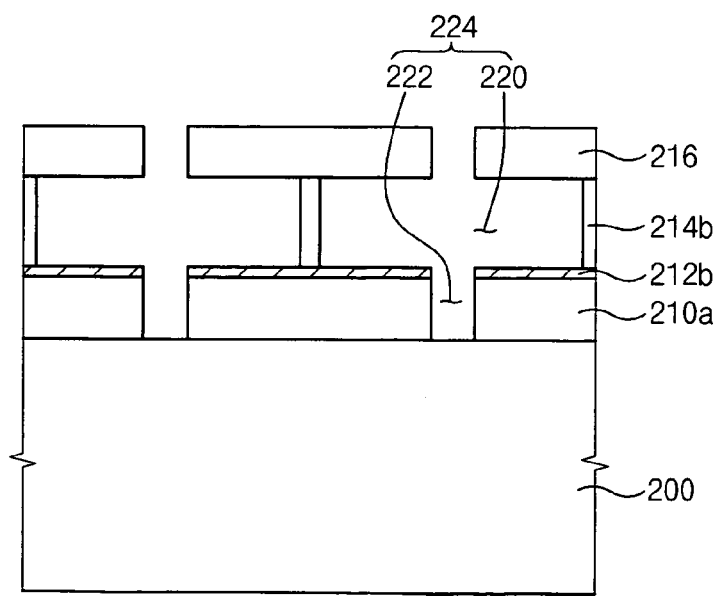

Referring to FIGS. 46 and 47, the preliminary etching stop layer pattern 212a and the first insulating interlayer pattern 210 exposed through the second holes 220 are anisotropically etched to form third holes 222 having a volume smaller than that of the second holes 220, the first insulating interlayer pattern 210a and the etching stop layer pattern 212b. Here, the third holes 222 have an opened upper end narrower than that of the second holes 220. The second and third holes 220 and 222 are referred to as the contact hole 224.

Figure 48:
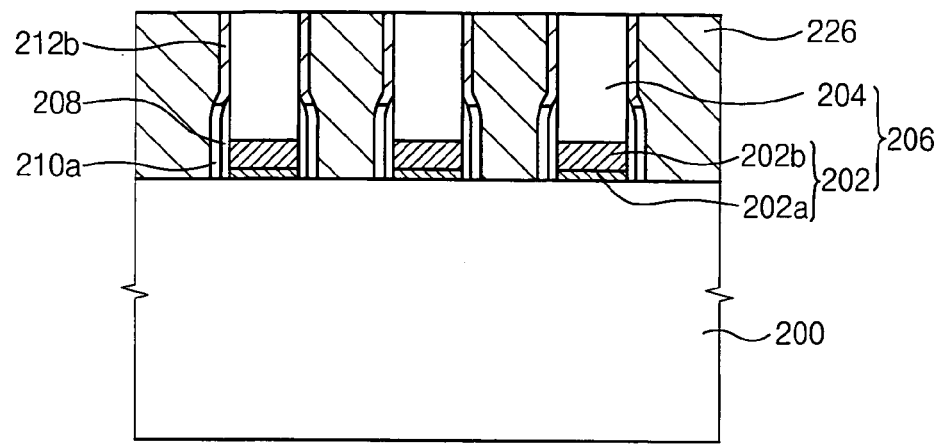
Figure 49:
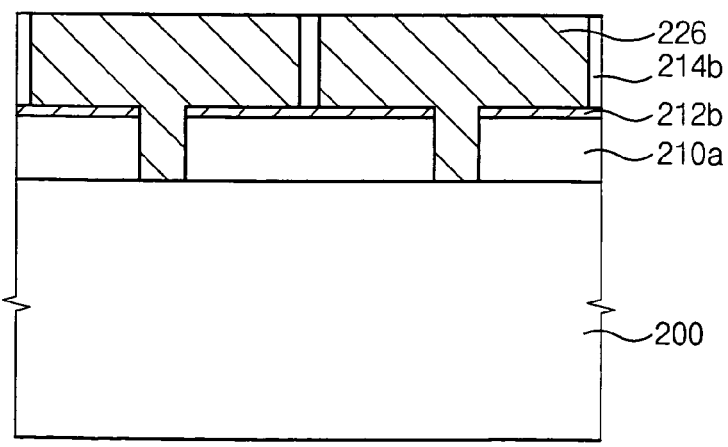

Referring to FIGS. 48 and 49, the contact hole 224 is filled with a conductive material. The conductive material and the mask pattern 216 are planarized to form the contact plugs 226.

Figure 50:
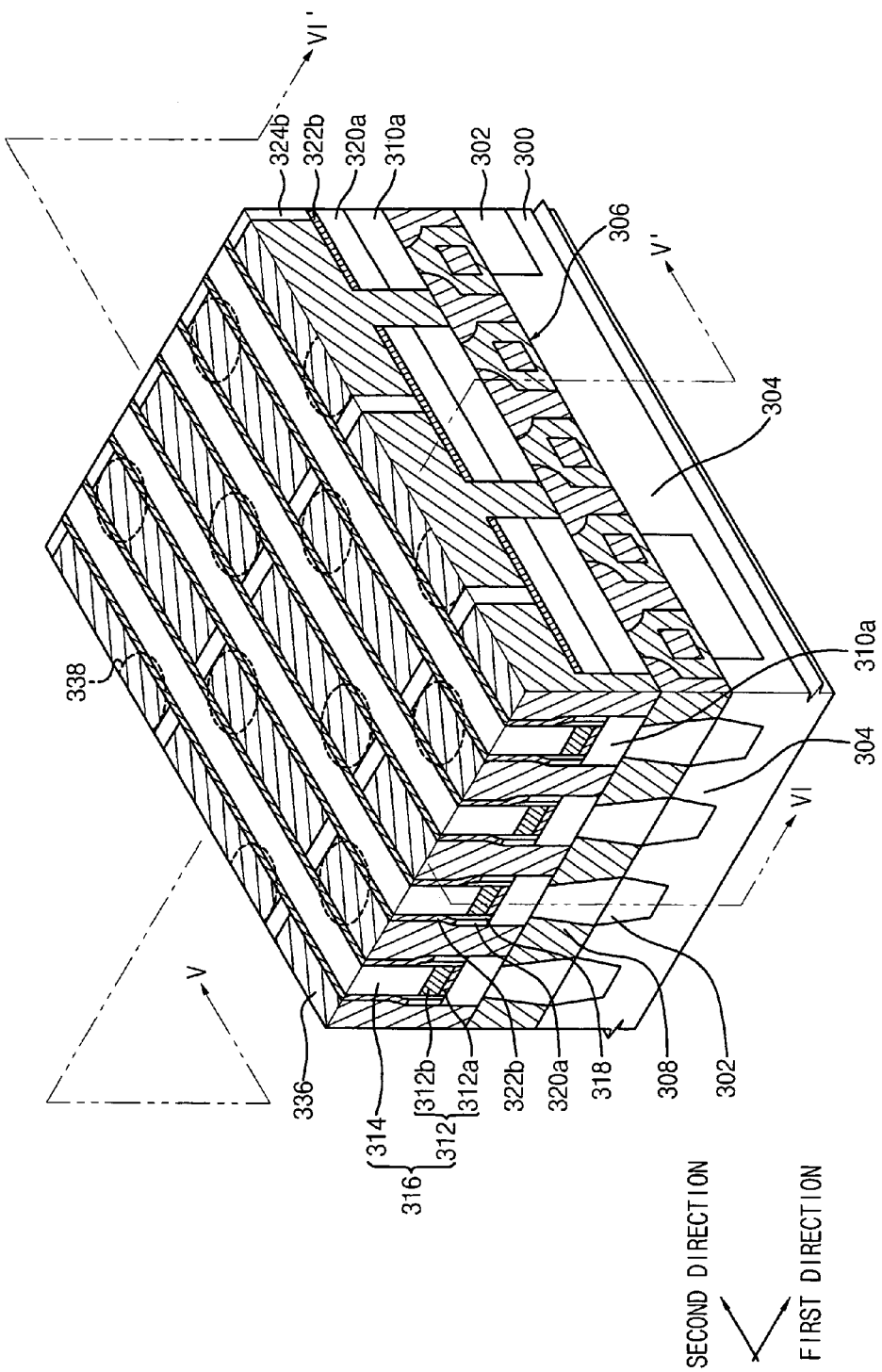
FIG. 50 is a perspective view illustrating a DRAM device in accordance with yet another embodiment of the present invention.

FIG. 50 is a perspective view illustrating a DRAM device in accordance with yet another embodiment of the present invention.

Referring to FIG. 50, an isolation layer 302 is formed in a semiconductor substrate 300 to define an active region 304 on the semiconductor substrate 300. Word line structures 306 and contact pads 308 are formed on the semiconductor substrate 300.

A first insulating interlayer pattern 310a is formed on the contact pads 308 and the word line structures 306. Bit line structures 316 are formed on the first insulating interlayer 310a. The bit line structures 316 include a conductive layer pattern 312 and a capping layer pattern 314. The conductive layer pattern 312 includes a barrier metal layer pattern 312a and a metal layer pattern 312b.

A spacer 318 and a second insulating interlayer pattern 320a partially cover the bit line structures 316. Particularly, the second insulating interlayer pattern 320a encloses the conductive layer pattern 312.

An etching stop layer pattern 322b is formed on the second insulating interlayer pattern 320a and encloses upper side faces of the bit line structures 316. A third insulating interlayer pattern 324b is formed on the etching stop layer pattern 322b to separate the bit line structures from each other. Contact plugs 336 are formed through the first, second, and third insulating interlayer patterns 310a, 320a and 324b between the bit line structures 316. Inclined storage node contact pads 338 are formed on the contact plugs 336.

Here, the contact plugs 336 have a lower portion and an upper portion wider than the lower portion. Also, the contact plugs 336, have a height and a width along a length direction of the bit line structures 316 longer than the height. In other words, the contact plugs 336 have substantially vertical and planar side faces, have a width longer than its height.

FIGS. 51 to 70 are cross-sectional views illustrating a method of manufacturing the contact plug in FIG. 50. FIGS. 51, 53, 55, 57, 59, 61, 63, 65, 67, and 69 are cross-sectional views taken along line V-V' in FIG. 50, and FIGS. 52, 54, 56, 58, 60, 62, 64, 66, 68, and 70 are cross-sectional views taken along line VI-VI' in FIG. 50.

Figure 51:
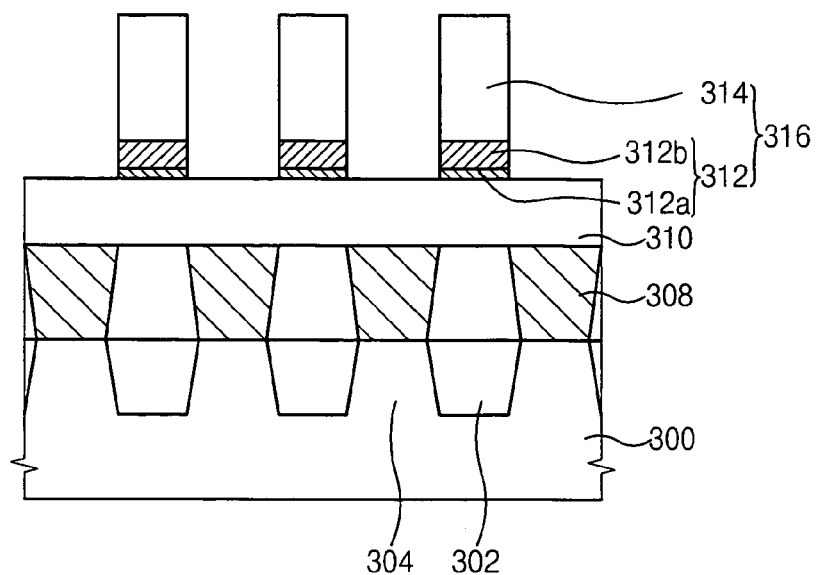
FIGS. 51 to 70 are cross-sectional views illustrating a method of manufacturing the DRAM device in FIG. 50.
Figure 52:
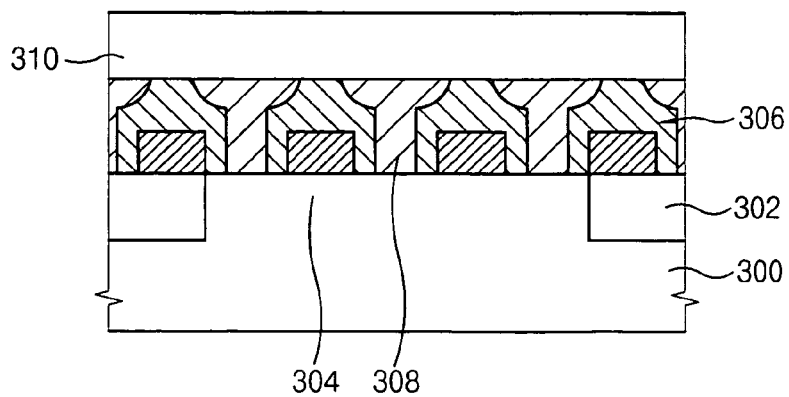

Referring to FIGS. 51 and 52, the isolation layer 302 is formed in the semiconductor substrate 300 to define the active region 304. The word line structures 306 and the contact pads 308 are formed on the semiconductor substrate 300.

The first insulating interlayer 310 is formed on the contact pads 308 and the word line structures 306. A conductive layer (not shown) and a capping layer (not shown) are sequentially formed on the semiconductor substrate 300 having the first insulating interlayer. 310. The conductive layer and the capping layer are patterned to form the bit line structures 316 including the conductive layer pattern 312 and the capping layer pattern 314. Here, the conductive layer pattern 312 includes a barrier metal layer pattern 312a and a metal layer pattern 312b. Examples of the barrier metal layer pattern 312a are a titanium layer, a titanium nitride layer, a combination thereof, etc. An example of the metal layer pattern 312b is a tungsten layer. An example of the capping layer pattern 314 is a silicon nitride layer.

Figure 53:
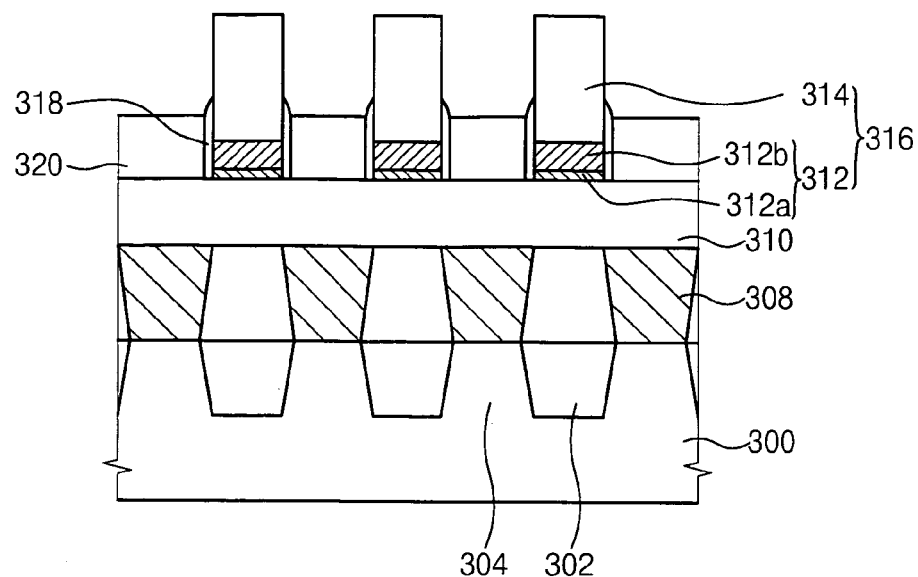
Figure 54:
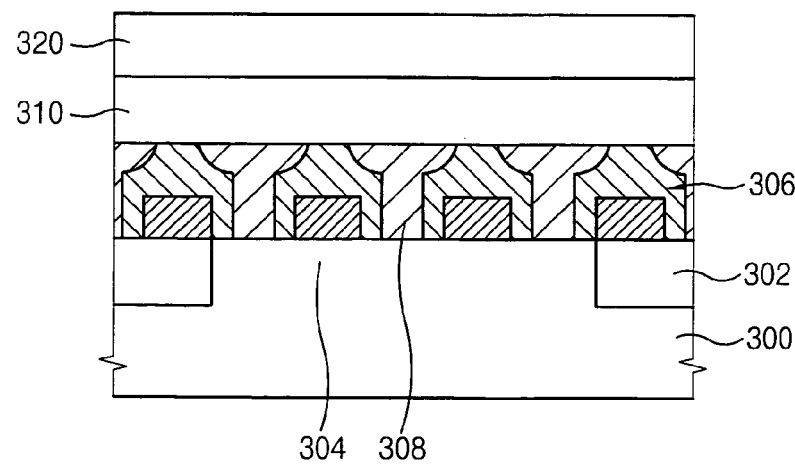

Referring to FIGS. 53 and 54, a silicon nitride layer (not shown) is formed on the semiconductor substrate 300 along the bit line structures 316. The silicon nitride layer is anisotropically etched to form the spacer 318. A second insulating interlayer (not shown) including silicon oxide covers the bit line structures 316 having the spacer 318. The second insulating interlayer is planarized via a CMP process until the bit line structures 316 are exposed. The planarized second insulating interlayer is anisotropically etched to form the second insulating interlayer pattern 320, partially filling a lower space between the bit line structures 316. Here, the second insulating interlayer pattern 320 has an upper face higher than that of the metal layer pattern 312b.

Figure 55:
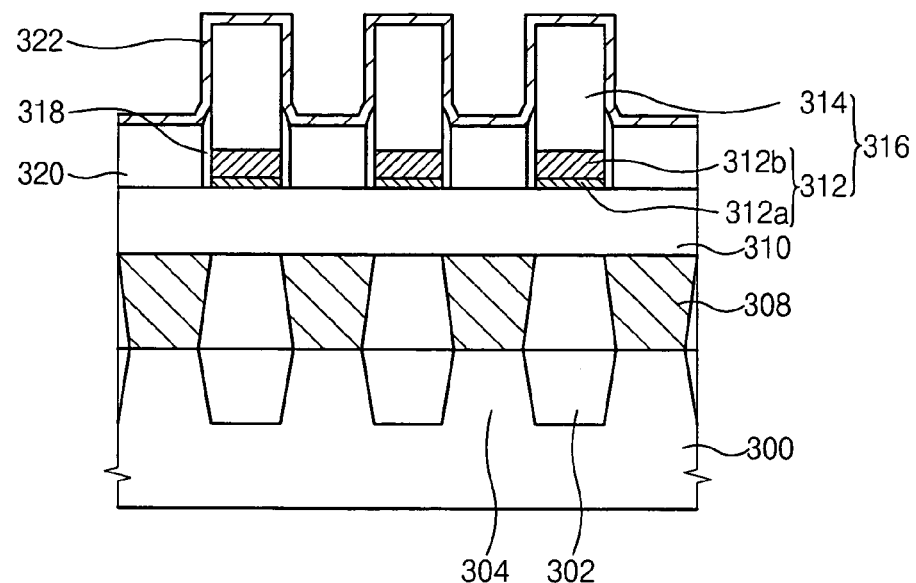
Figure 56:
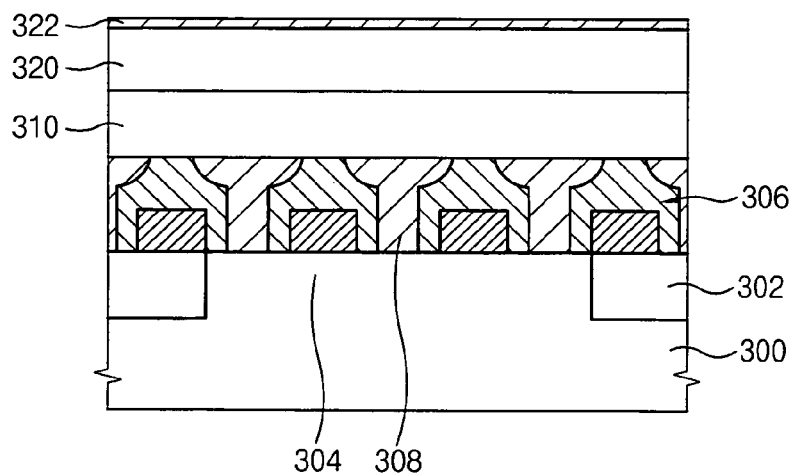

Referring to FIGS. 55 and 56, the etching stop layer 322 including silicon nitride is formed on the bit line structures 316 and the second insulating interlayer pattern 320.

Figure 57:
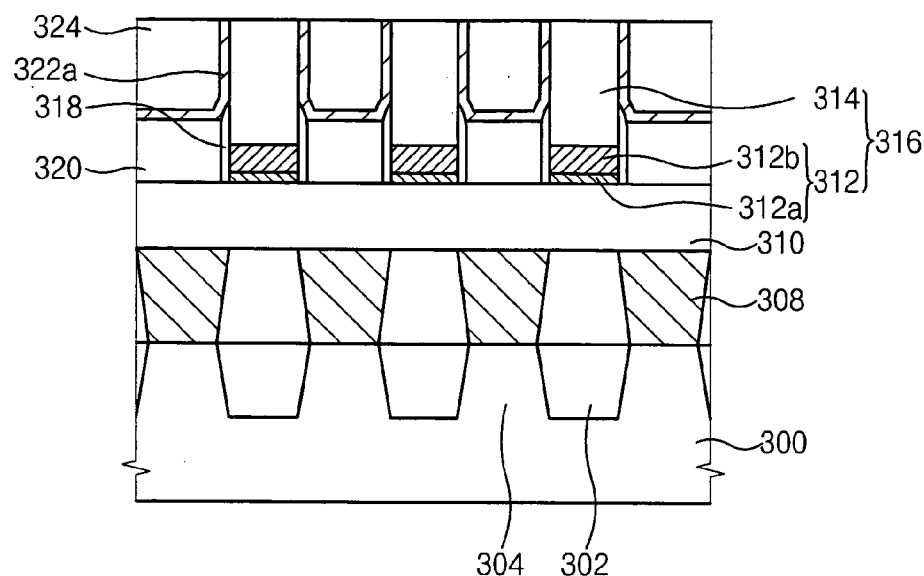
Figure 58:
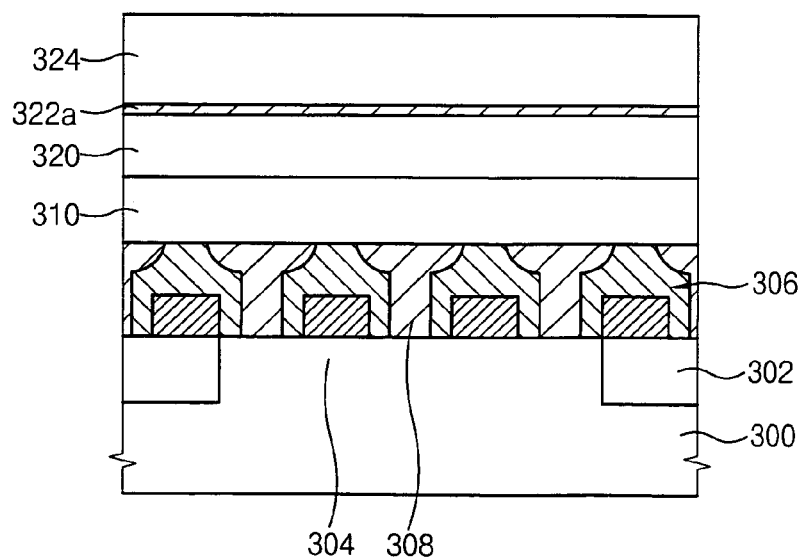

Referring to FIGS. 57 and 58, a third insulating interlayer 324 is formed on the etching stop layer 322 to fill the space between the bit line structures 316. The third insulating interlayer 324 and the etching stop layer 322 are planarized until the bit line structures 316 are exposed to form the preliminary etching stop layer pattern 322a.

Figure 59:
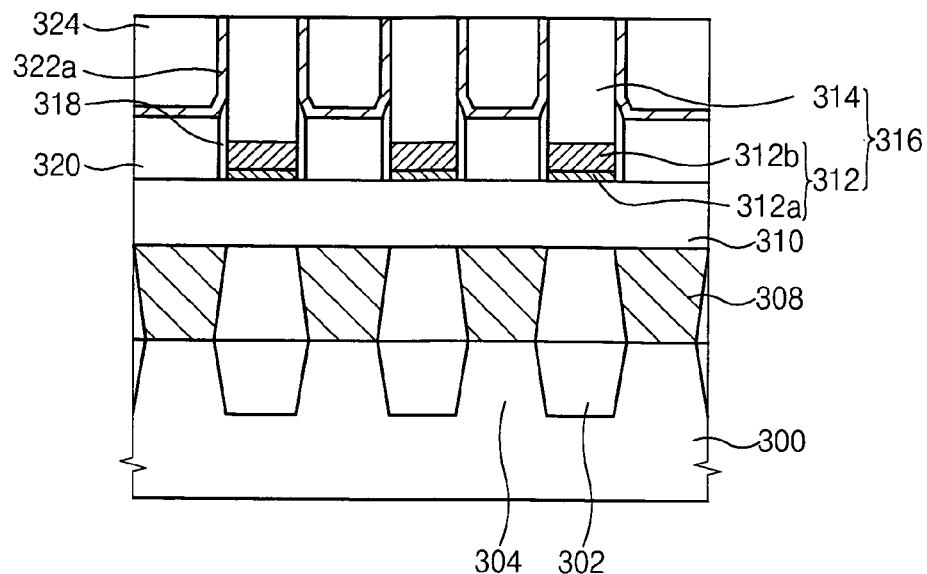
Figure 60:
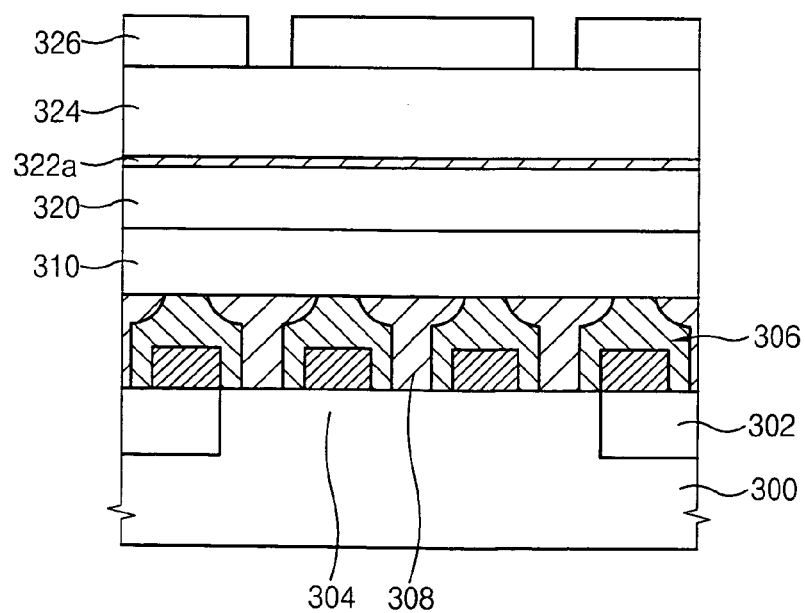

Referring to FIGS. 59 and 60, a mask layer (not shown) including polysilicon is formed on the planarized third insulating interlayer 324. The mask layer is patterned to form a mask pattern 326 for defining storage node contact holes.

Figure 61:
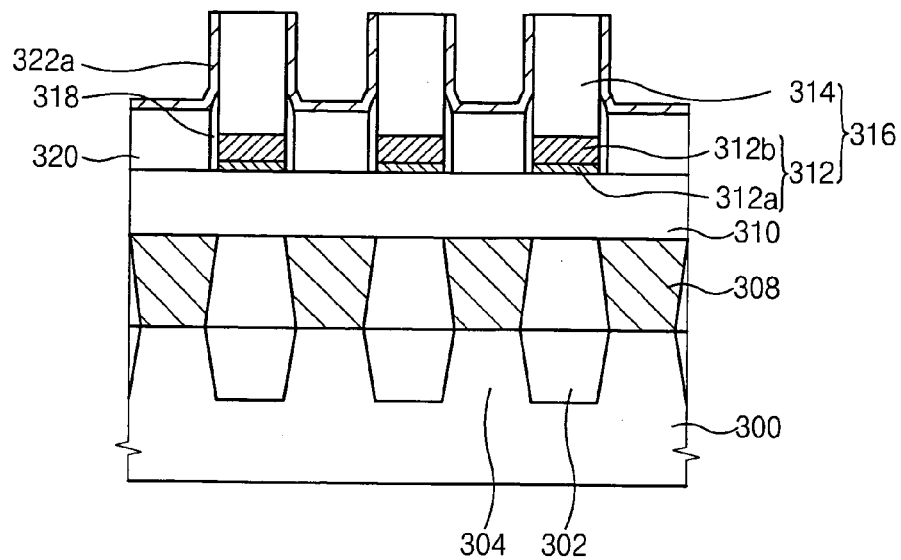
Figure 62:
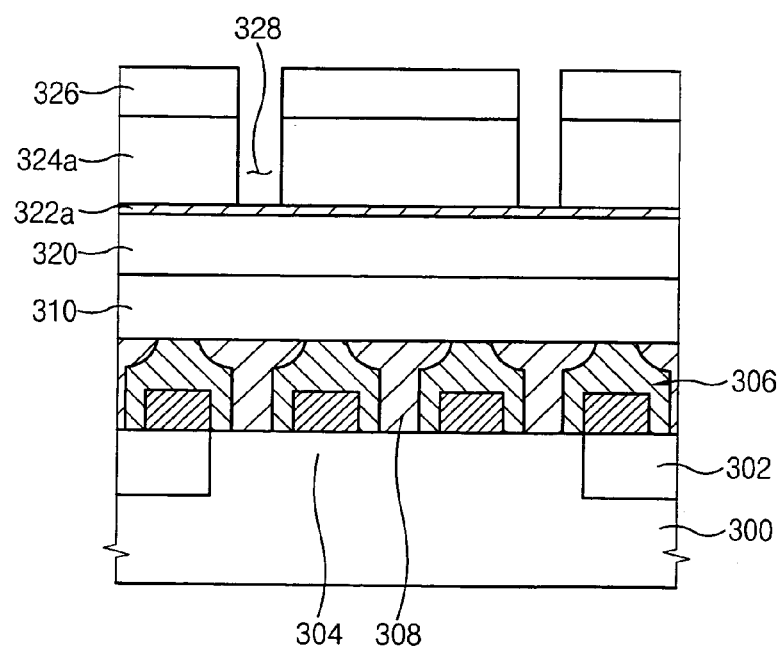

Referring to FIGS. 61 and 62, the third insulating interlayer 324 is anisotropically etched using the mask pattern 326 as an etching mask to form the third insulating interlayer pattern 324a having first holes 328 that expose the preliminary etching stop layer pattern 322a.

Figure 63:
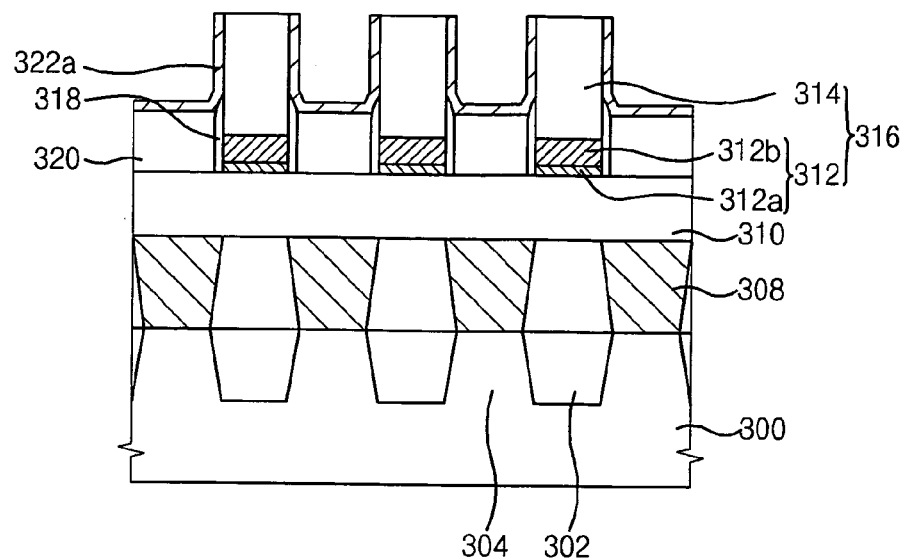
Figure 64:
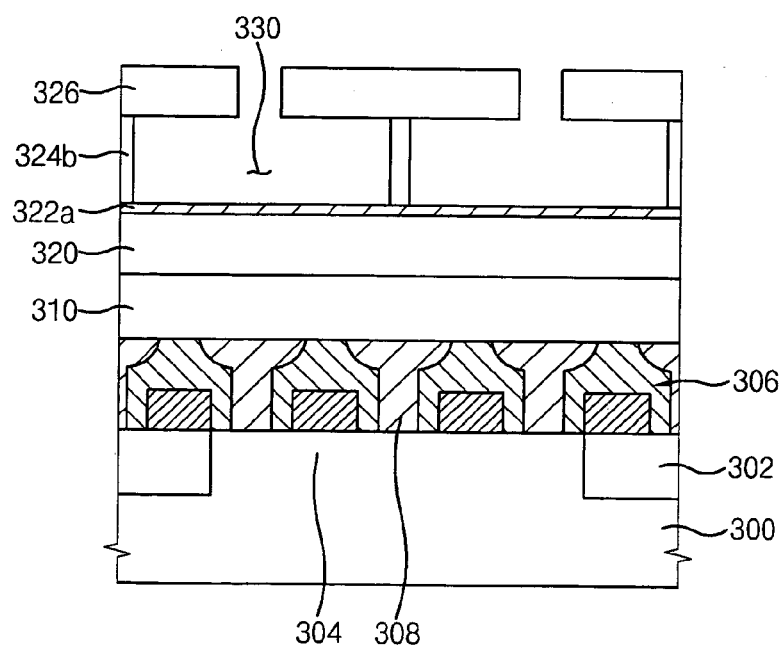

Referring to FIGS. 63 and 64, the third insulating interlayer pattern 324a that is exposed through the first holes 328 is partially and isotropically etched by a wet etching process to form the third insulating interlayer pattern 324b having second holes 330 expanding from the first holes 328 in a direction of the bit line structures 316. Here, the third insulating interlayer pattern 324b partially remains between the second holes 330.

Figure 65:
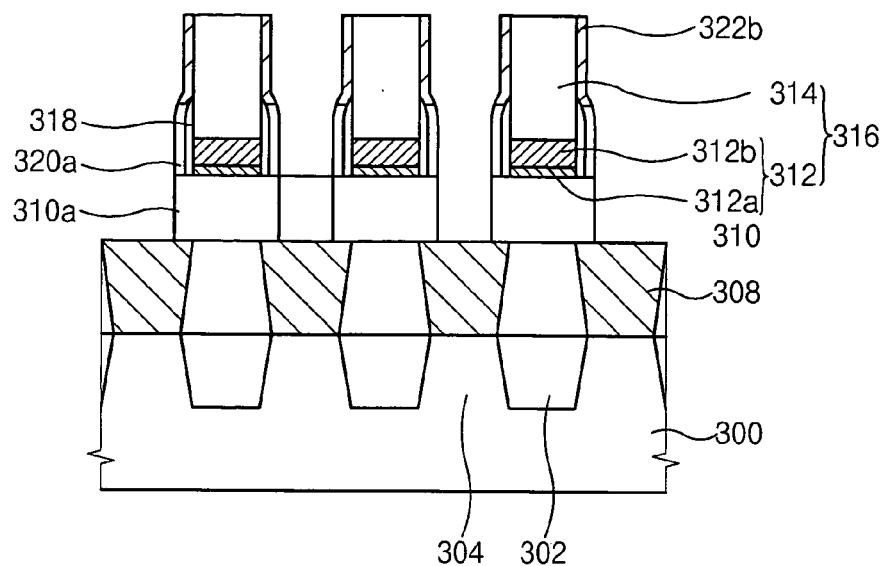
Figure 66:
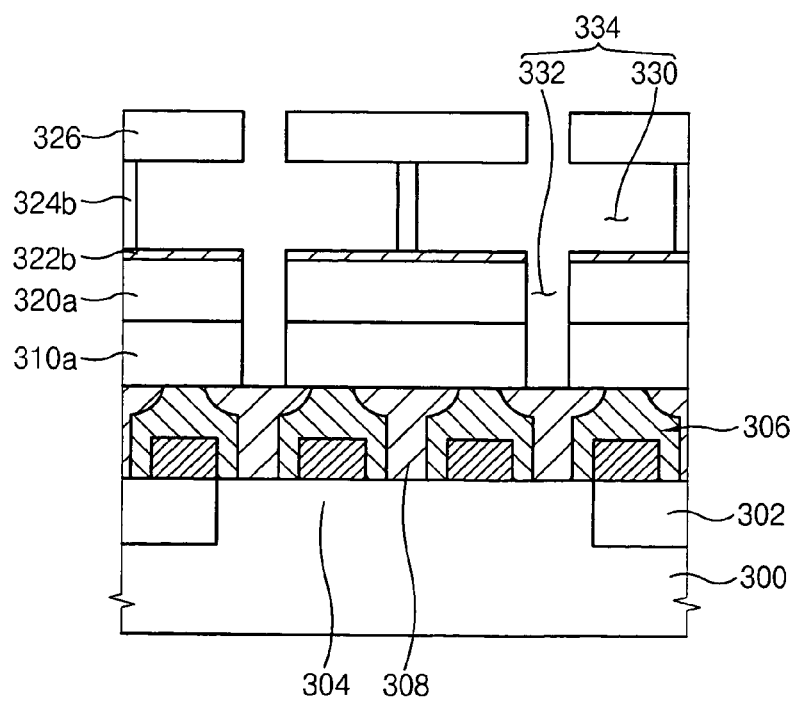

Referring to FIGS. 65 and 66, the preliminary etching stop layer pattern 322a, the first insulating interlayer 310 and the second insulating interlayer pattern 320 exposed through the second holes 330 are anisotropically etched to form third holes 332 having a volume smaller than that of the second holes 330, the first insulating interlayer pattern 310a, the second insulating interlayer pattern 320a, and the etching stop layer pattern 322b. Here, the third holes 332 have an opened upper end narrower than that of the second holes 330. The second and third holes 330 and 332 are referred to as the storage node contact hole 334.

Figure 67:
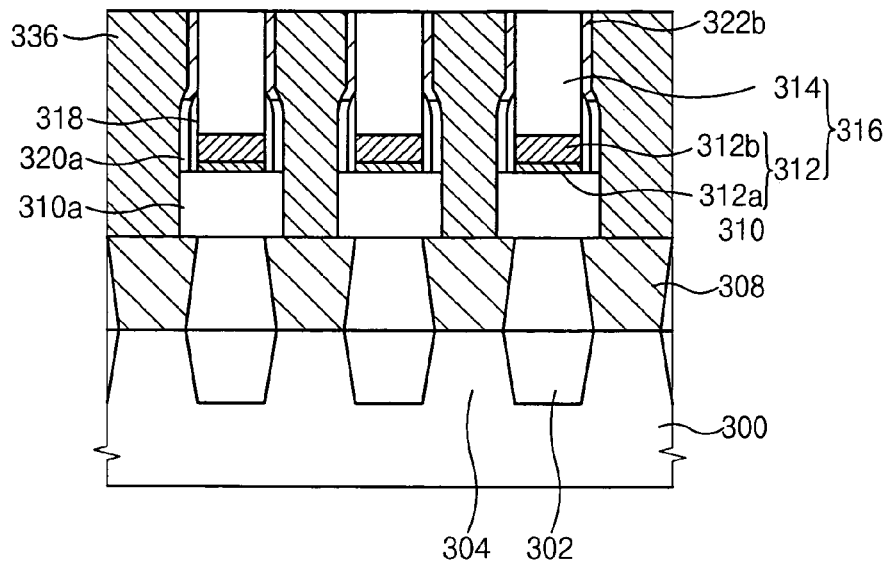
Figure 68:
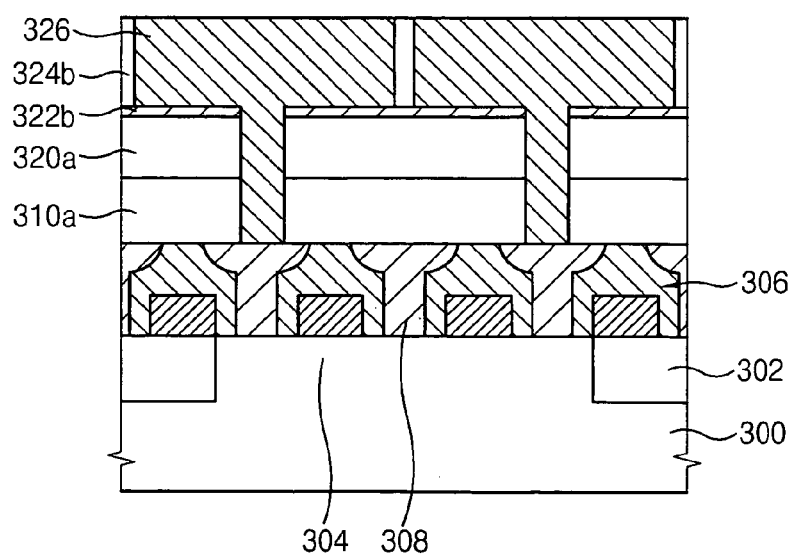

Referring to FIGS. 67 and 68, the storage node contact hole 334 is filled with a conductive material. The conductive material and the mask pattern 326 are planarized to form the storage node contact plugs 336.

Figure 69:
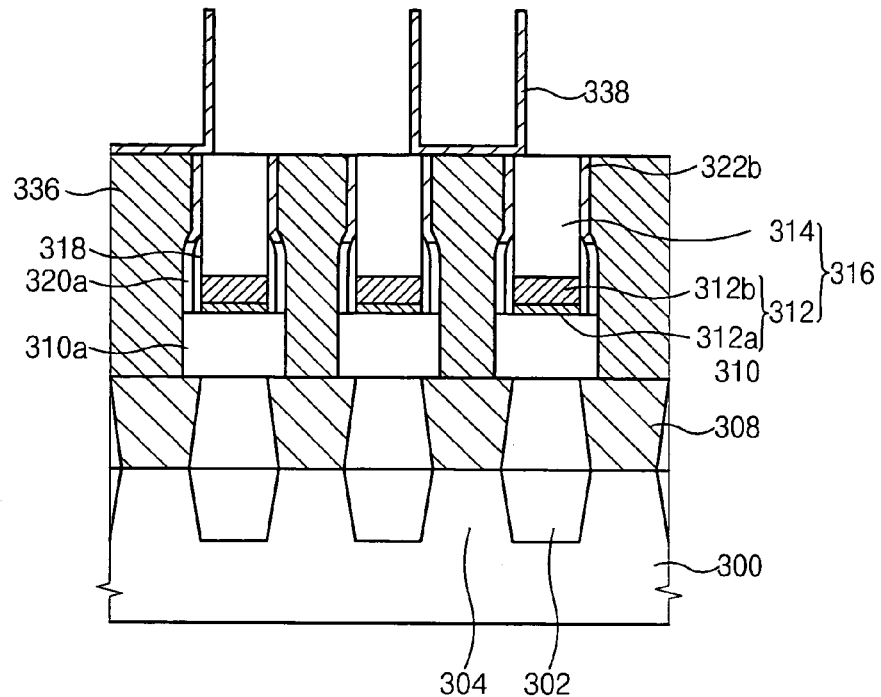
Figure 70:
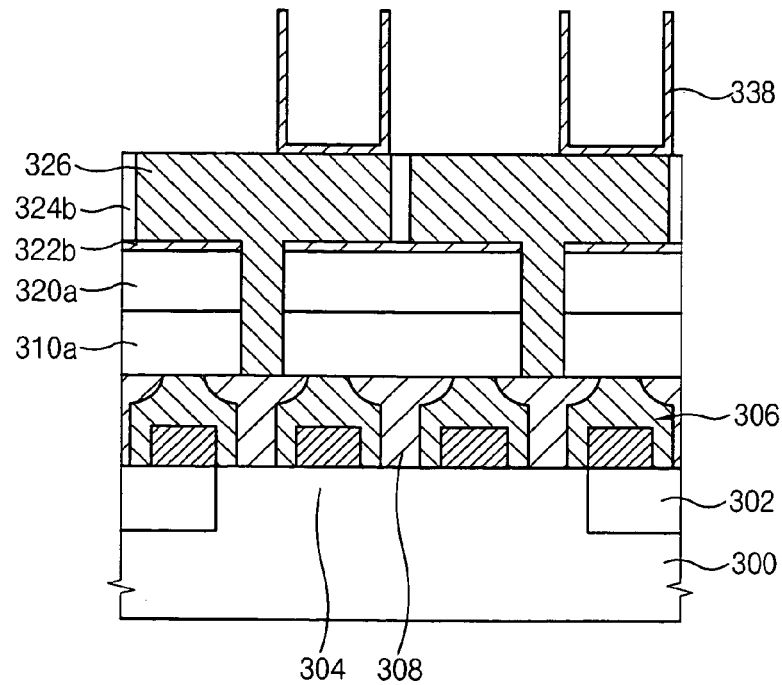

Referring to FIGS. 69 and 70, the storage node electrode 338 is formed on the storage node contact plug 336. Here, since the storage node contact plug 336 has a wide upper face, the storage node electrode 338 may be slanted.

Additionally, a dielectric layer (not shown) and a plate electrode (not shown) are formed on the storage node electrode 338 to complete a capacitor.

According to the present invention, since the storage node contact plugs have vertical side faces, the storage node contact plugs have uniform upper widths regardless of the polished amounts, thereby ensuring a sufficient overlap margin between the storage node contact plug and the storage node electrode.

Also, the etching stop layer is used in the wet etching process as well as the anisotropic etching process for expanding the upper portion of the storage node contact hole so that recipes for the wet etching process may be readily selected.

Having described the preferred embodiments of the present invention, it is noted that modifications and variations can be made by persons skilled in the art in light of the above teachings. It is therefore to be understood that changes may be made in the particular embodiment of the present invention disclosed which is within the scope and the spirit of the invention outlined by the appended claims.

What is claimed is:

1. A method of manufacturing a semiconductor device, comprising:
    forming word line structures in a first direction on a substrate of which an active region is defined;
    forming source/drain regions in the active region at both sides, respectively, of the word line structures;
    forming a first insulating interlayer on the substrate having the word line structures;
    forming first and second contact pads through the first insulating interlayer to allow the first and second contact pads to contact the source/drain regions, respectively;
    forming a second insulating interlayer on the substrate having the first and second contact pads;
    forming bit line structures in a second direction substantially perpendicular to the first direction on the second insulating interlayer to allow the bit line structures to contact the first contact pad, the bit line structures being substantially perpendicular to the word line structures;
    forming an insulation layer structure on the second insulating interlayer;
    patterning the insulation layer structure to form storage node contact holes between the bit line structures, the storage node contact holes having a lower portion and an upper portion wider than the lower portion, and the upper portion of the storage node contact holes extending in the second direction and having a side face substantially perpendicular to the first direction;
    filling the storage node contact holes with a conductive material to form storage node contact plugs; and
    forming storage node electrodes on the storage node contact plugs.

2. The method of claim 1, wherein forming the insulation layer structure further comprises;
    forming a third insulating interlayer pattern on the second insulating interlayer to fill a lower space between the bit line structures;
    forming an etching stop layer on the third insulating interlayer pattern and the bit line structures; and
    forming a fourth insulating interlayer pattern on the etching stop layer to fill an upper space between the bit line structures that is positioned over the lower space.

3. The method of claim 2, wherein forming the third insulating interlayer pattern comprises:
    forming a third insulating interlayer on the second insulating interlayer to fill the lower space;
    planarizing the third insulating interlayer to expose the bit line structures; and
    partially etching the third insulating interlayer to form the third insulating interlayer pattern.

4. The method of claim 2, wherein forming the fourth insulating interlayer pattern comprises:
    forming a fourth insulating interlayer on the etching stop layer to fill the upper space; and
    planarizing the fourth insulating interlayer until the etching stop layer is exposed to form the fourth insulating interlayer pattern.

5. The method of claim 2, wherein forming the storage node contact holes comprises:
    forming a mask pattern on the fourth insulating interlayer pattern and the etching stop layer pattern, the mask pattern exposing the second contact pad;
    anisotropically etching the fourth insulating interlayer using the mask pattern as an etching mask to form a first opening;
    isotropically etching the fourth insulating interlayer using the mask pattern and the etching stop layer as an etching mask to form a second opening expanding from the first opening; and
    etching the etching stop layer, the third insulating interlayer and the second insulating interlayer using the mask pattern as an etching mask to form a third hole in communication with the second hole.

6. The method of claim 5, wherein forming the mask pattern comprises:
    forming a mask layer on the fourth insulating interlayer pattern and the etching stop layer;
    forming a photoresist pattern on the mask layer;
    etching the mask layer using the photoresist pattern as an etching mask to form the mask pattern; and
    removing the photoresist pattern.

7. The method of claim 1, wherein forming the word line structures comprises:
sequentially forming a gate insulation layer, a gate electrode layer and a hard mask layer; and
patterning the hard mask layer, the gate electrode layer and the gate insulation layer to form the word line structures including a hard mask pattern, a gate electrode pattern and a gate insulation layer pattern.

8. The method of claim 1, wherein forming the first and second contact pads comprises:
etching the first insulating interlayer to form a contact hole exposing the source/drain regions;
filling the contact hole with a conductive layer to allow the conductive layer to contact the source/drain regions; and
planarizing the conductive layer until the word line structures are exposed to form the first and second contact pads.

9. The method of claim 1, wherein forming the bit line structures comprises:
sequentially forming a barrier metal layer, a tungsten layer, and a hard mask layer on the second insulating interlayer; and
patterning the hard mask layer, the tungsten layer, and the barrier metal layer to form the bit line structure including a barrier metal layer pattern, a tungsten layer pattern, and a hard mask pattern.

10. The method of claim 1, further comprising forming a spacer on a sidewall of the bit line structures.

11. The method of claim 1, wherein forming the storage node contact plugs comprises:
filling the storage node contact holes with a conductive layer; and
planarizing the conductive layer until the bit line structures are exposed to form the storage node contact plugs.

12. The method of claim 11, wherein the conductive layer comprises doped polysilicon.

13. The method of claim 1, wherein the storage node electrodes correspond to the storage node contact plugs, respectively, the storage node electrodes being arranged in a zigzag pattern, so that a line connected between adjacent storage node electrodes are diagonal to the first and second direction.

14. A method of manufacturing a semiconductor device, comprising:
forming conductive structures on a substrate;
filling a lower space between the conductive structures with a first insulating interlayer pattern;
forming an etching stop layer on the first insulating interlayer pattern and the conductive structures;
forming a second insulating interlayer on the etching stop layer to fill an upper space between the conductive structures that is positioned over the lower space;
planarizing the second insulating interlayer and the etching stop layer until the conductive structures are exposed to form a second insulating interlayer pattern and an etching stop layer pattern; and
partially etching the second insulating interlayer pattern, the etching stop layer pattern and the first insulating interlayer pattern to form contact holes, the contact holes having a lower portion and an upper portion wider than the lower portion, and the upper portion of the contact holes having a height and a width in a length direction of the conductive structures longer than the height; and
filling the contact holes with a conductive material to form contact plugs.

15. The method of claim 14, wherein forming the conductive structures comprises:
sequentially forming a conductive layer and a capping layer on the substrate; and
patterning the conductive layer and the capping layer to form the conductive structures including a conductive layer pattern and a capping layer pattern.

16. The method of claim 15, wherein the first insulating interlayer pattern has an upper face higher than that of the conductive layer pattern.

17. The method of claim 14, wherein forming the first insulating interlayer pattern comprises:
forming a first insulating interlayer on the substrate to fill the lower space;
planarizing the first insulating interlayer to expose the conductive structures; and
anisotropically etching the first insulating interlayer to form the first insulating interlayer pattern.

18. The method of claim 14, wherein forming the contact holes comprises:
forming a mask pattern on the second insulating interlayer pattern, the mask pattern exposing the upper and lower spaces;
anisotropically etching the second insulating interlayer using the mask pattern as an etching mask until the etching stop layer pattern to form a first hole;
isotropically etching the second insulating interlayer to form a second hole that expands from the first opening in a lengthwise direction of the conductive structures; and
anisotropically etching the etching stop layer pattern and the first insulating interlayer pattern using the mask pattern as an etching mask to form a third hole having a size smaller than that of the second hole.

19. The method of claim 18, wherein forming the mask pattern comprises:
forming a mask layer on the second insulating interlayer pattern; and
etching the mask layer to form the mask pattern.

20. The method of claim 18, wherein forming the contact plug comprises:
filling the second and third contact holes with a conductive layer; and
planarizing the conductive layer and the mask pattern to form the contact plug.

21. The method of claim 14, after forming the conductive structures, further comprising forming a spacer on a sidewall of the conductive structures.

22. A method of manufacturing a semiconductor device, comprising:
forming a first insulating interlayer on a substrate on which an active region is defined;
forming bit line structures on the first insulating interlayer;
filling a lower space between the bit line structures with a second insulating interlayer pattern;
forming an etching stop layer on the second insulating interlayer pattern and the bit line structures;
forming a third insulating interlayer on the etching stop layer;

planarizing the third insulating interlayer and the etching stop layer until the bit line structures are exposed to form a third insulating interlayer pattern and an etching stop layer pattern;

partially etching the third insulating interlayer pattern, the etching stop layer pattern, the second insulating interlayer, and the first insulating interlayer to form storage node contact holes, the storage node contact holes having a lower portion and an upper portion wider than the lower portion, and the upper portion of the storage node contact holes having a height and a width in a lengthwise direction of the bit line structures longer than the height;

filling the storage node contact holes with a conductive material to form storage node contact plugs; and forming capacitors on the storage node contact plugs.

23. The method of claim 22, after forming the bit line structures, further comprising forming a spacer on a sidewall of the bit line structures.

24. The method of claim 22, wherein the capacitors are arranged diagonally to the bit line structures.

* * * * *